US012635379B2

(12) United States Patent
Joo et al.

(10) Patent No.: US 12,635,379 B2
(45) Date of Patent: May 19, 2026

(54) DISPLAY APPARATUS

(71) Applicant: Samsung Display Co., Ltd., Yongin-si (KR)

(72) Inventors: Sunkyu Joo, Yongin-si (KR); Keunchan Oh, Yongin-si (KR); Taimei Kodaira, Yongin-si (KR); Sangji Park, Yongin-si (KR); Dokyung Youn, Yongin-si (KR); Wooman Ji, Yongin-si (KR); Taehyung Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 323 days.

(21) Appl. No.: 18/346,421

(22) Filed: Jul. 3, 2023

(65) Prior Publication Data

US 2024/0016024 A1    Jan. 11, 2024

(30) Foreign Application Priority Data

Jul. 5, 2022    (KR) ........................ 10-2022-0082763

(51) Int. Cl.
*H10K 59/38* (2023.01)
*H10K 59/35* (2023.01)

(52) U.S. Cl.
CPC .......... *H10K 59/38* (2023.02); *H10K 59/351* (2023.02); *H10K 59/353* (2023.02)

(58) Field of Classification Search
CPC .... H10K 59/38; H10K 59/351; H10K 59/353; H10K 50/13; H10K 50/81–82
See application file for complete search history.

(56) References Cited

U.S. PATENT DOCUMENTS

| | | | |
|---|---|---|---|
| 6,863,997 B2 | 3/2005 | Thompson et al. | |
| 6,869,695 B2 | 3/2005 | Thompson et al. | |
| 8,305,388 B2 | 11/2012 | Park et al. | |
| 10,192,932 B2 | 1/2019 | Steckel et al. | |

(Continued)

FOREIGN PATENT DOCUMENTS

| | | |
|---|---|---|
| KR | 10-2010-0041583 | 4/2010 |
| KR | 1020160000569 A | 1/2016 |

(Continued)

OTHER PUBLICATIONS

Machine translation KR 20220093875 A (Year: 2022).*

*Primary Examiner* — Anne M Hines
*Assistant Examiner* — Jose M Diaz
(74) *Attorney, Agent, or Firm* — CANTOR COLBURN LLP

(57) ABSTRACT

A display apparatus includes organic light-emitting diodes respectively corresponding to first pixels, second pixels, third pixels, and fourth pixels, a first color-converting layer disposed on an organic light-emitting diode corresponding to one of the first pixels and including first quantum dots, a first color filter disposed on the first color-converting layer, a second color-converting layer disposed on an organic light-emitting diode corresponding to one of the second pixels and including second quantum dots, and a second color filter disposed on the second color-converting layer, and the second pixels and the fourth pixels are disposed along a same row, and one of the fourth pixels is disposed between two adjacent second pixels.

19 Claims, 16 Drawing Sheets

(56) References Cited

U.S. PATENT DOCUMENTS

| | | | |
|---|---|---|---|
| 10,461,131 | B2 | 10/2019 | Steckel et al. |
| 10,930,713 | B2 | 2/2021 | Lee |
| 11,139,348 | B2 | 10/2021 | Kim et al. |
| 2015/0228697 | A1 | 8/2015 | Liu et al. |
| 2019/0157354 | A1 | 5/2019 | Lee et al. |
| 2022/0209157 | A1* | 6/2022 | Lee ........................ H10K 59/38 |

FOREIGN PATENT DOCUMENTS

| | | | |
|---|---|---|---|
| KR | 1020190058130 A | 5/2019 | |
| KR | 10-2020-0041044 | 4/2020 | |
| KR | 10-2020-0063964 | 6/2020 | |
| KR | 20220093875 A | * 7/2022 | ......... H01L 51/5268 |

* cited by examiner

DISPLAY APPARATUS

CROSS-REFERENCE TO RELATED APPLICATION(S)

This application claims priority to and benefits of Korean Patent Application No. 10-2022-0082763 under 35 U.S.C. § 119, filed on Jul. 5, 2022, in the Korean Intellectual Property Office, the entire contents of which are incorporated herein by reference.

BACKGROUND

1. Technical Field

One or more embodiments relate to a structure of a display apparatus.

2. Description of the Related Art

A display apparatus visually displays data. The display apparatus may include a substrate divided into a display area and a peripheral area. A scan line is insulated from a data line in the display area, and pixels may be arranged in the display area. A thin-film transistor and a pixel electrode electrically connected to the thin-film transistor may be provided in the display area, wherein each of the thin-film transistor and the pixel electrode corresponds to each of the pixels. An opposite electrode may be provided in the display area, wherein the opposite electrode is provided in common to the pixels. Various wirings, a scan driver, a data driver, a controller, a pad portion, and the like that transfer electrical signals to the display area may be provided in the peripheral area.

The usage of display apparatuses has diversified. Accordingly, a design to improve quality of a display apparatus has been variously tried.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus in which colors of light emitted from respective pixels are clearly implemented, with an improved light-extraction efficiency and a reduced reflectivity. However, such a technical problem is an example, and the disclosure is not limited thereto.

Additional aspects will be set forth in part in the description which follows and, in part, will be apparent from the description, or may be learned by practice of the embodiments of the disclosure.

According to one or more embodiments, a display apparatus may include organic light-emitting diodes disposed over a lower substrate, respectively corresponding to first pixels of a first color, second pixels of a second color, third pixels of a third color, and fourth pixels of a fourth color, and each of the organic light-emitting diodes including a stack structure of a first electrode, an intermediate layer, and a second electrode; a first color-converting layer disposed on an organic light-emitting diode corresponding to one of the first pixels and including first quantum dots that convert incident light to light of the first color; a first color filter disposed on the first color-converting layer and having the first color; a second color-converting layer disposed on an organic light-emitting diode corresponding to one of the second pixels and including second quantum dots that convert the incident light to light of the second color; a second color filter disposed on the second color-converting layer and having the second color; and a first transmissive layer disposed on an organic light-emitting diode corresponding to one of the third pixels, wherein the second pixels and the fourth pixels are disposed along a same row, one of the fourth pixels is disposed between two adjacent second pixels, and the intermediate layer may include at least two emission layers that emit lights of different colors.

The intermediate layer may include a first emission layer, a second emission layer, and a third emission layer, and the first emission layer emits blue light, the second emission layer emits green light, and the third emission layer emits red light.

The fourth pixels may be white pixels that emit white light.

The display apparatus may further include a second transmissive layer disposed on an organic light-emitting diode corresponding to one of the fourth pixels, wherein the first transmissive layer and the second transmissive layer may include a same material.

The fourth pixels may each include a first sub-pixel, a second sub-pixel, and a third sub-pixel, the first sub-pixel and the first color emit light of a same color, the second sub-pixel and the second color emit light of a same color, and the third sub-pixel and the third color emit light of a same color.

The display apparatus may further include a second transmissive layer disposed on an organic light-emitting diode corresponding to one of the fourth pixels, wherein the first transmissive layer and the second transmissive layer may include a same material.

The first sub-pixel may include a first sub-color filter having the first color, the second sub-pixel may include a second sub-color filter having the second color, and the third sub-pixel may include a third sub-color filter having the third color.

The intermediate layer may include a first emission layer and a second emission layer, and the first emission layer emits blue light and the second emission layer emits green light.

The fourth pixels may be white pixels that emit white light.

The display apparatus may further include a third color-converting layer disposed on an organic light-emitting diode corresponding to one of the fourth pixels, and the third color-converting layer may include the first quantum dots and the second quantum dots.

The fourth pixels may each include a first sub-pixel, a second sub-pixel, and a third sub-pixel, and the first sub-pixel and the first color emit light of a same color, the second sub-pixel and the second color emit light of a same color, and the third sub-pixel and the third color emit light of a same color.

The first sub-pixel may include a first sub-color filter having the first color, the second sub-pixel may include a second sub-color filter having the second color, and the third sub-pixel may include a third sub-color filter having the third color.

The display apparatus may further include a third color-converting layer disposed on an organic light-emitting diode corresponding to one of the first sub-pixel, the second sub-pixel, and the third sub-pixel, wherein the third color-converting layer may include the first quantum dots and the second quantum dots.

The display apparatus may further include a fourth color-converting layer disposed inside of a region of the first sub-pixel; a fifth color-converting layer disposed inside of a region of the second sub-pixel; and a third transmissive layer disposed inside of a region of the third sub-pixel, wherein the fourth color-converting layer and the first color-converting layer may include a same material, the fifth color-converting layer and the second color-converting layer may include a same material, and the third transmissive layer and the first transmissive layer may include a same material as a material.

The second pixels may be disposed along a first row, the first pixels and the third pixels may be alternately disposed with the second pixels disposed between the first pixels and the third pixels along a second row parallel to the first row, and the first row and the second row may be repeatedly disposed in a column direction.

The second pixels and the fourth pixels may be alternately repeated along the first row.

The display apparatus may have a pattern including first to n-th second pixels of the second pixels and one of the fourth pixels, n being a natural number, and the pattern is repeatedly disposed in the display apparatus.

A number of the fourth pixels may be white pixels that emit white light, and another number of the fourth pixels may include a first sub-pixel, a second sub-pixel, and a third sub-pixel, and the first sub-pixel and the first color emit light of a same color, the second sub-pixel and the second color emit light of a same color, and the third sub-pixel and the third color emit light of a same color.

The white pixel, the first sub-pixel, the second sub-pixel, and the third sub-pixel may be disposed along a same row.

A row in which the white pixel is disposed and a row in which the first sub-pixel, the second sub-pixel, and the third sub-pixel are disposed may be different rows parallel to each other.

BRIEF DESCRIPTION OF THE DRAWINGS

The above and other aspects, features, and advantages of embodiments will be more apparent from the following description taken in conjunction with the accompanying drawings, in which:

FIG. 12 is a schematic plan view of a portion of a display area of a display apparatus according to an embodiment;

FIG. 13 is a schematic plan view of a portion of a display area of a display apparatus according to an embodiment;

DETAILED DESCRIPTION OF THE EMBODIMENTS

Figure 1:
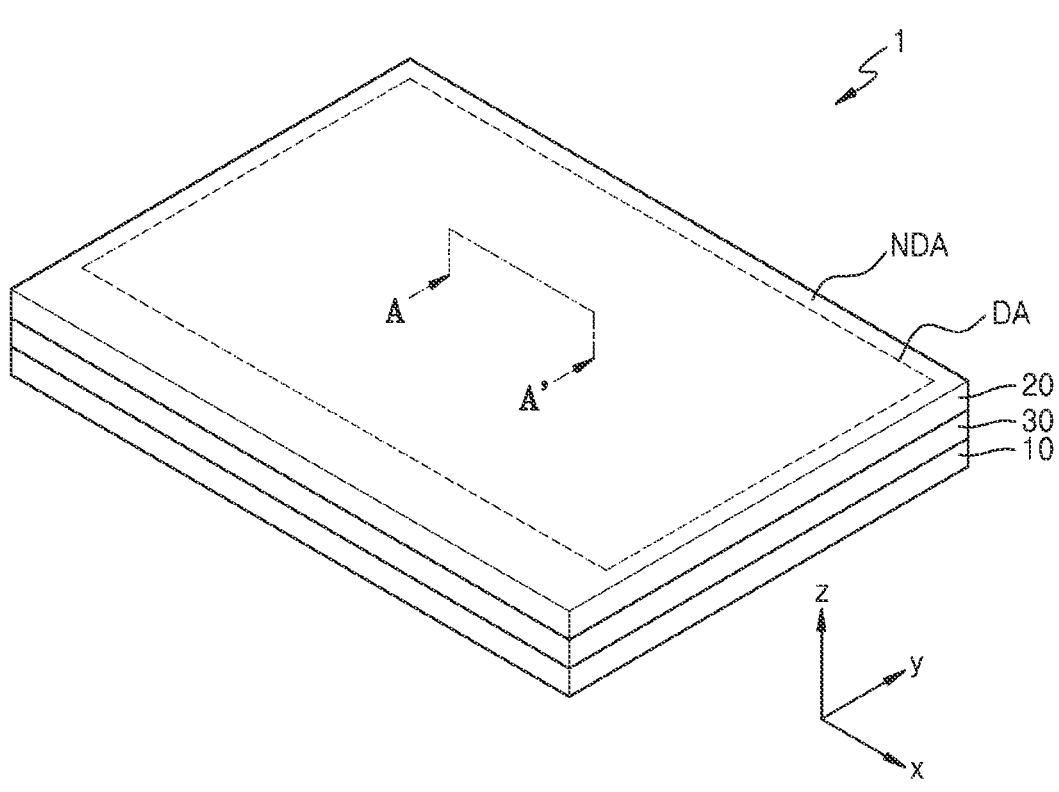
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof may be omitted. In the drawings, sizes, thicknesses, ratios, and dimensions of the elements may be exaggerated for ease of description and for clarity.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

As used herein, the singular forms "a," "an," and "the" are intended to include the plural forms as well unless the context clearly indicates otherwise.

It will be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be further understood that, when a layer, region, or component is referred to as being "on" another layer, region, or component, it can be directly or indirectly on the other layer, region, or component. For example, intervening layers, regions, or components may be present.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where an embodiment may be implemented differently, a specific process order may be performed in the order different from the described order. As an example, two processes successively described may be simultaneously performed substantially and performed in the opposite order.

It will be understood that when a layer, region, or component is referred to as being "connected" or "coupled" to another layer, region, or component, it may be "directly connected" or directly coupled to the other layer, region, or component or may be "indirectly connected" or indirectly coupled to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, layers, region, regions, or component or components interposed therebetween.

It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display apparatus 1 according to an embodiment.

Referring to FIG. 1, the display apparatus 1 may display images. The display apparatus 1 may display images by using pixels arranged in a display area DA. Each pixel of the display apparatus 1 may be a region that emits light of a preset color. The display apparatus 1 may display images by using lights emitted from the pixels. As an example, the pixel may emit red, green, or blue light. As another example, the pixel may emit red, green, blue, or white light.

A non-display area NDA may surround at least a portion of the display area DA. In an embodiment, the non-display area NDA may surround the display area DA entirely. The non-display area NDA may be a region in which images are not displayed. The non-display area NDA may surround at least a portion of the display area DA or may surround the display area DA entirely.

As shown in FIG. 1, the display area DA may have a polygonal shape including a quadrangular shape. As an example, the display area DA may have a rectangular shape in which a horizontal length thereof is greater than a vertical length, a rectangular shape in which a horizontal length thereof is less than a vertical length, or a square shape. As an example, the display area DA may have various shapes such as an elliptical shape or a circular shape. It is to be understood that the shapes disclosed herein include shapes substantial to the shapes disclosed herein. In an embodiment, the display apparatus 1 may include an emission panel 10, a color panel 20, and a filling layer 30. The emission panel 10, the filling layer 30, and the color panel 20 may be stacked in a thickness direction (for example, a z direction).

The display apparatus 1 having the above structure may be included in mobile phones, televisions, advertisement boards, monitors, tablet personal computers (PCs), notebook computers, and the like within the spirit and the scope of the disclosure.

Figure 2:
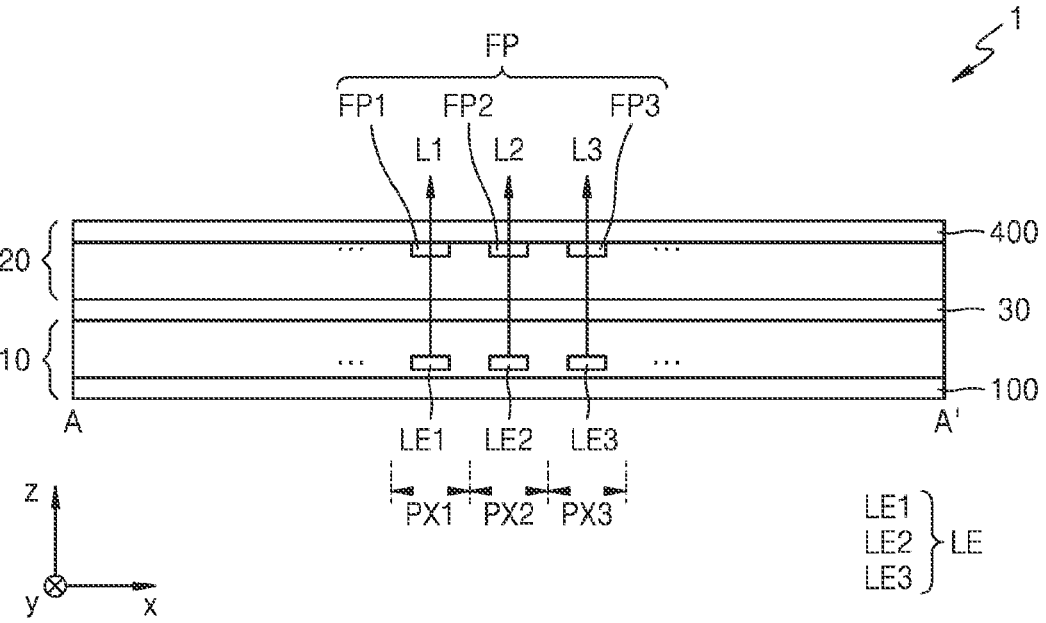
FIG. 2 is a schematic cross-sectional view of a display apparatus according to an embodiment.

FIG. 2 is a schematic cross-sectional view of the display apparatus 1 according to an embodiment.

Referring to FIG. 2, the display apparatus 1 may include a first pixel PX1, a second pixel PX2, and a third pixel PX3. The first pixel PX1, the second pixel PX2, and the third pixel PX3 may be pixels that respectively emit lights of different colors. As an example, the first pixel PX1 may emit light L1 of a first color, the second pixel PX2 may emit light L2 of a second color, and the third pixel PX3 may emit light L3 of a third color. The light L1 of the first color may be red light, the light L2 of the second color may be green light, and the light L3 of the third color may be blue light.

The display apparatus 1 may include the emission panel 10, the color panel 20, and the filling layer 30. The emission panel 10 may include a lower substrate 100 and a light-emitting element LE. The light-emitting element LE may include, for example, an organic light-emitting diode. In an embodiment, the first pixel PX1, the second pixel PX2, and the third pixel PX3 may each include the light-emitting element LE. As an example, the first pixel PX1 may include a first light-emitting element LE1. The first light-emitting element LE1 may be a first organic light-emitting diode. The second pixel PX2 may include a second light-emitting element LE2. The second light-emitting element LE2 may be a second organic light-emitting diode. The third pixel PX3 may include a third light-emitting element LE3. The third light-emitting element LE3 may be a third organic light-emitting diode.

The first light-emitting element LE1, the second light-emitting element LE2, and the third light-emitting element LE3 may emit light of the same color. In an embodiment, the first light-emitting element LE1, the second light-emitting element LE2, and the third light-emitting element LE3 may emit light of a color in which blue light and green light are mixed. In an embodiment, the first light-emitting element LE1, the second light-emitting element LE2, and the third light-emitting element LE3 may emit light of a color in which blue light and red light are mixed. In an embodiment, the first light-emitting element LE1, the second light-emitting element LE2, and the third light-emitting element LE3 may emit light of a color in which blue light, green light, and red light are mixed.

The first light-emitting element LE1, the second light-emitting element LE2, and the third light-emitting element LE3 may each include a structure in which two or more emitting units that emit lights of different colors may be sequentially stacked each other. For example, the first organic light-emitting diode, the second organic light-emitting diode, and the third organic light-emitting diode may be tandem light-emitting diodes. The first organic light-emitting diode, the second organic light-emitting diode, and the third organic light-emitting diode may improve a color purity and an emission efficiency by having a stack structure of light-emitting units. In an embodiment, the first light-emitting element LE1, the second light-emitting element LE2, and the third light-emitting element LE3 may each have a stack structure of light-emitting units respectively emitting blue light and green light. In an embodiment, the first light-emitting element LE1, the second light-emitting element LE2, and the third light-emitting element LE3 may each have a stack structure of light-emitting units respectively emitting blue light and red light. In an embodiment, the first light-emitting element LE1, the second light-emitting element LE2, and the third light-emitting element LE3 may each have a stack structure of light-emitting units respectively emitting red light, blue light, and green light.

The color panel 20 may include an upper substrate 400 and a filter portion FP. In an embodiment, the filter portion FP may include a first filter portion FP1, a second filter portion FP2, and a third filter portion FP3. Light emitted from the first light-emitting element LE1 may pass through the first filter portion FP1, and be emitted as the light L1 of the first color. Light emitted from the second light-emitting element LE2 may pass through the second filter portion FP2, and be emitted as the light L2 of the second color. Light emitted from the third light-emitting element LE3 may pass through the third filter portion FP3, and be emitted as the light L3 of the third color.

The filter portion FP may include a functional layer and a color filter layer. In an embodiment, the functional layer may include a first quantum dot layer, a first transmissive layer, and a second transmissive layer. In an embodiment, the color filter layer may include a first color filter, a second color filter, and a third color filter. In an embodiment, the first filter portion FP1 may include the first quantum dot layer and the first color filter, the second filter portion FP2 may include the second quantum dot layer and the second color filter, and the third filter portion FP3 may include the first transmissive layer and the third color filter.

The filter portion FP may be directly disposed on (for example, on a lower surface of the upper substrate) the upper substrate 400. "Being directly disposed on the upper substrate" may mean that the color panel 20 is manufactured by directly forming the first color filter, the second color filter, and the third color filter on the upper substrate 400. The color panel 20 may be bonded to the emission panel 10 such that the first filter portion FP1, the second filter portion FP2, and the third filter portion FP3 respectively face the first light-emitting element LE1, the second light-emitting element LE2, and the third light-emitting element LE3.

The filling layer 30 may be disposed between the emission panel 10 and the color panel 20. The filling layer 30 may attach the emission panel 10 to the color panel 20. In an embodiment, the filling layer 30 may include a thermosetting or photocurable filler. Though not shown, one of the emission panel 10 and the color panel 20 may include a column spacer. As an example, the emission panel 10 may include the column spacer protruding toward the color panel 20. As another example, the color panel 20 may include the color spacer protruding toward the emission panel 10. Accordingly, the light-emitting elements LE and the filter portions FP may each maintain a preset distance, and the display apparatus 1 may maintain uniform brightness according to the position.

Figure 3:
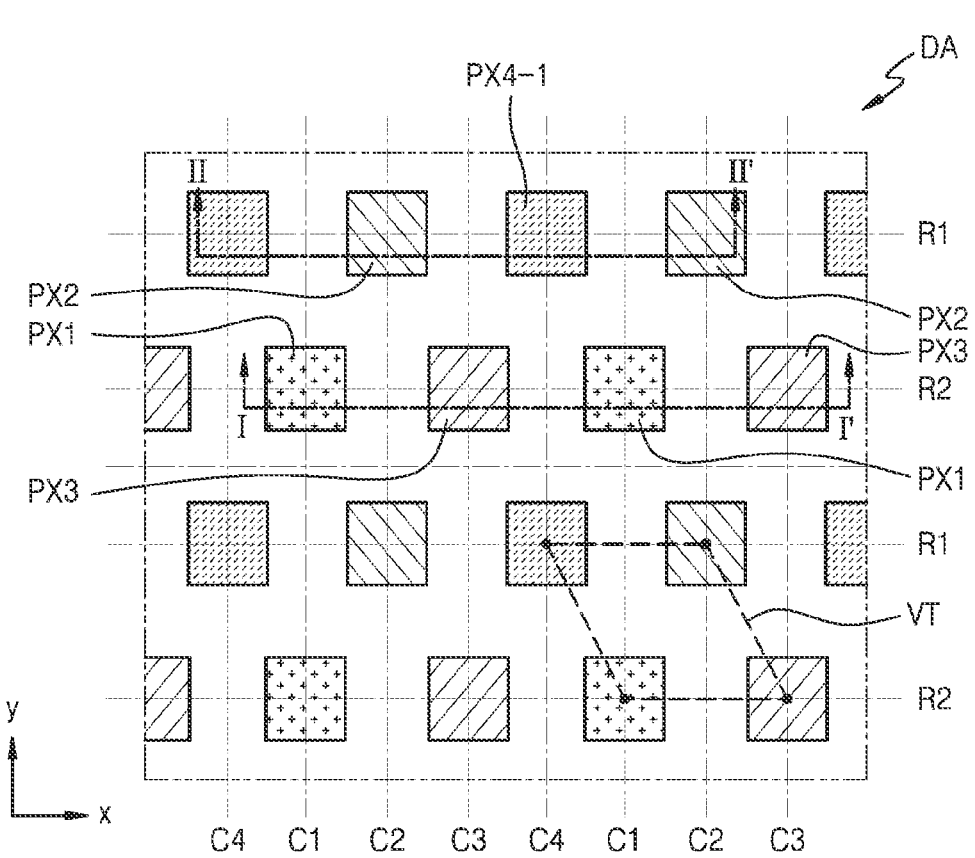
FIG. 3 is a schematic plan view of a portion of a display area of a display apparatus according to an embodiment.

FIG. 3 is a schematic plan view of a portion of the display area DA of the display apparatus 1 according to an embodiment.

Referring to FIG. 3, the display apparatus 1 may include an array of the pixels arranged in the display area DA. The array of the pixels may include the first pixels PX1, the second pixels PX2, the third pixels PX3, and fourth pixels PX4-1 arranged two dimensionally. In an embodiment, the array of the pixels may have configuration in which a minimal repeating unit is repeatedly arranged in the x direction and the y direction, wherein the minimal repeating unit may include one first pixel PX1, one second pixel PX2, one third pixel PX3, and one fourth pixel PX4-1. The minimal repeating unit is a repeating unit having a lowest number of pixels. The centers of the first pixel PX1, the second pixel PX2, the third pixel PX3, and one fourth pixel PX4-1 may be located at vertexes of a virtual quadrangle VT (for example, a parallelogram).

The array of the pixels has a two-dimensional configuration of the minimal repeating units and may have different configurations in the x direction and the y direction.

The pixels are arranged in the x direction, in which the array of the pixels may have a configuration where two rows in the x direction are repeatedly arranged. The second pixels PX2 and the fourth pixels PX4-1 may be alternately arranged in a first row R1 in the x direction, and the first pixels PX1 and the third pixels PX3 may be alternately arranged in a second row R2 parallel to the first row R1 and in the x direction. The array of the pixels may have a structure, in which the first row R1 and the second row R2 having the above structure are repeatedly arranged.

The pixels are arranged in the y direction, in which the pixels emit light of the same color may be arranged in each column in the y direction. The first pixels PX1 may be arranged along a first column C1, the second pixels PX2 may be arranged along a second column C2, and the third pixels PX3 may be arranged along a third column C3. The fourth pixels PX4-1 may be arranged along a fourth column C4. The array of the pixels may have a structure, in which the first column C1, the second column C2, the third column C3, and the fourth column C4 are repeatedly arranged.

The first pixels PX1 emit light of the first color, the second pixels PX2 configured to emit light of the second color, the third pixels PX3 emit light of the third color, and the fourth pixels PX4-1 emit light of a fourth color may be arranged to be apart from each other with a non-pixel area therebetween. The second pixel PX2 may be arranged at a position apart in the y direction from a virtual point between the first pixel PX1 and the third pixel PX3 adjacent to each other in the x direction. The fourth pixel PX4-1 may be arranged between two second pixels PX2 adjacent to each other in the x direction. Accordingly, a distance between two adjacent second pixels PX2 is greater than a distance between the first pixel PX1 and the third pixel PX3 adjacent to each other.

Figure 4A:
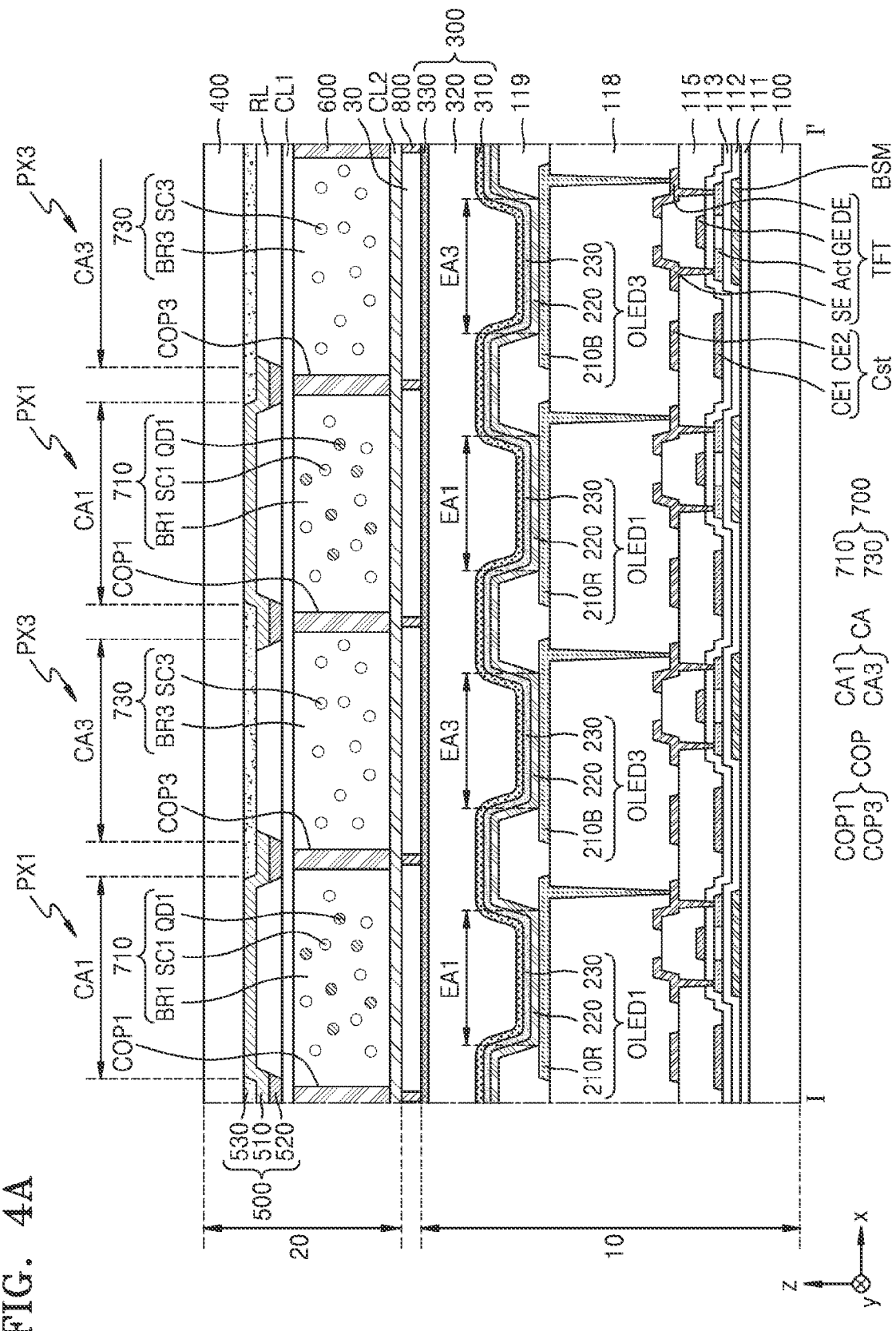
FIG. 4A is a schematic cross-sectional view of a color panel of FIG. 3, taken along line I-I' of FIG. 3.
Figure 4B:
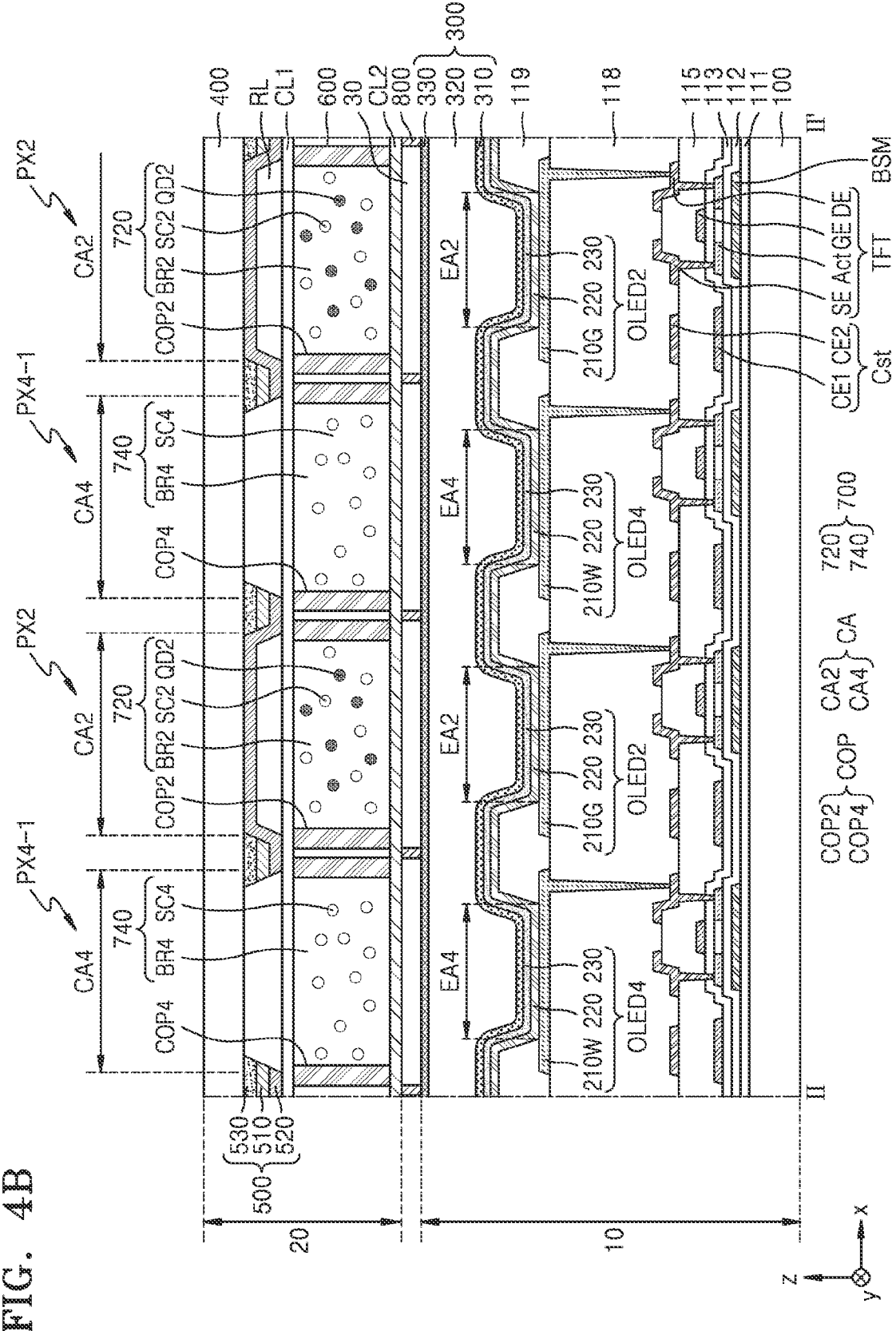
FIG. 4B is a schematic cross-sectional view of a color panel of FIG. 3, taken along line II-IT of FIG. 3.

FIG. 4A is a schematic cross-sectional view of the color panel 20 of FIG. 3, taken along line I-I' of FIG. 3, and FIG. 4B is a schematic cross-sectional view of the color panel 20 of FIG. 3, taken along line II-IT of FIG. 3.

Referring to FIGS. 4A and 4B, the display apparatus 1 may include the first pixel PX1, the second pixel PX2, the third pixel PX3, and the fourth pixel PX4-1 arranged in the display area DA. The first pixel PX1, the second pixel PX2, the third pixel PX3, and the fourth pixel PX4-1 may implement different lights. As an example, the first pixel PX1 may implement red light, the second pixel PX2 may implement green light, and the third pixel PX3 may implement blue light. The fourth pixel PX4-1 may implement white light in which red light, green light, and blue light are mixed.

The display apparatus 1 may include the emission panel 10, the color panel 20, and the filling layer 30. The emission panel 10 may include the lower substrate 100 and a light-emitting element, wherein the light-emitting element is disposed over the lower substrate 100 and may include an emission layer 220. The light-emitting element may be an organic light-emitting diode. In an embodiment, the emission panel 10 may include a first organic light-emitting diode OLED1, a second organic light-emitting diode OLED2, a third organic light-emitting diode OLED3, and a fourth organic light-emitting diode OLED4 disposed over the lower substrate 100. The first organic light-emitting diode OLED1, the second organic light-emitting diode OLED2, the third organic light-emitting diode OLED3, and the fourth organic light-emitting diode OLED4 may each include the emission layer 220.

Hereinafter, a stack structure of the emission panel 10 is described in detail. In an embodiment, the emission panel 10 may include the lower substrate 100, a first buffer layer 111, a bias electrode BSM, a second buffer layer 112, a thin-film transistor TFT, a storage capacitor Cst, a gate insulating layer 113, an interlayer insulating layer 115, a planarization layer 118, a light-emitting element, and an encapsulation layer 300. The thin-film transistor TFT may include a semiconductor layer Act, a gate electrode GE, a source electrode SE, and a drain electrode DE. The storage capacitor Cst may include a first electrode CE1 and a second electrode CE2.

The lower substrate 100 may include a glass material, a ceramic material, metal, or a flexible or bendable material. In the case where the lower substrate 100 is flexible or bendable, the lower substrate 100 may include a polymer resin including polyethersulfone, polyacrylate, polyetherimide, polyethylene naphthalate, polyethylene terephthalate, polyphenylene sulfide, polyarylate, polyimide, polycarbonate, and cellulose acetate propionate. The lower substrate 100 may have a single-layered structure or a multi-layered structure of the above materials, and may further include an inorganic layer in the case of the multi-layered structure. In an embodiment, the lower substrate 100 may have a structure of an organic material/an inorganic material/an organic material.

A barrier layer (not shown) may be further disposed between the lower substrate 100 and the first buffer layer 111. The barrier layer may prevent or reduce the penetration of impurities from the lower substrate 100 and the like to the semiconductor layer Act. The barrier layer may include an inorganic material, an organic material, or an organic/inorganic composite material, and include a single layer or a multi-layer including an inorganic material and an organic material, the inorganic material including oxide or nitride.

The bias electrode BSM may be disposed on the first buffer layer 111 to correspond to the thin-film transistor TFT. In an embodiment, a voltage may be applied to the bias electrode BSM. The bias electrode BSM may prevent external light reaching the semiconductor layer Act. Accordingly, the characteristics of the thin-film transistor TFT may be stabilized. The bias electrode BSM may be omitted depending on the case.

The semiconductor layer Act may be disposed on the second buffer layer 112. The semiconductor layer Act may include amorphous silicon or polycrystalline silicon. In an embodiment, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layer Act may include Zn-oxide-based material and include Zn-oxide, In—Zn oxide, and Ga—In—Zn oxide. In an embodiment, the semiconductor layer Act may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO. The semiconductor layer Act may include a channel region, a drain region, and a source region, the drain region and the source region being on two opposite sides of the channel region. The semiconductor layer Act may include a single layer or a multi-layer.

The gate electrode GE may be disposed over the semiconductor layer Act with the gate insulating layer 113 therebetween. The gate electrode GE may at least partially overlap the semiconductor layer Act. The gate electrode GE may include at least one of molybdenum (Mo), aluminum (Al), copper (Cu), titanium (Ti) and the like and include a single layer or a multi-layer. As an example, the gate electrode GE may include a single Mo layer. The first electrode CE1 of the storage capacitor Cst may be disposed on the same layer as the gate electrode GE. The first electrode CE1 may include the same material or a similar material as a material of the gate electrode GE.

Though it is shown in FIGS. 4A and 4B that the gate electrode GE of the thin-film transistor TFT is disposed separate from the first electrode CE1 of the storage capacitor Cst, the storage capacitor Cst may overlap the thin-film transistor TFT. The gate electrode GE of the thin-film transistor TFT may serve as the first electrode CE1 of the storage capacitor Cst.

The interlayer insulating layer 115 may be provided to cover the gate electrode GE and the first electrode CE1 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may include zinc oxide (ZnO) and/or zinc peroxide ($ZnO_2$).

The second electrode CE2 of the storage capacitor Cst, the source electrode SE, and the drain electrode DE may be disposed on the interlayer insulating layer 115. The second electrode CE2 of the storage capacitor Cst, the source electrode SE, and the drain electrode DE may each include a conductive material including molybdenum (Mo), aluminum (Al), copper (Cu), titanium (Ti), and the like, and include a multi-layer or a single layer including the above materials. As an example, the second electrode CE2, the source electrode SE and the drain electrode DE may each have a multi-layered structure of Ti/Al/Ti. The source electrode SE and the drain electrode DE may be connected to a source region or a drain region of the semiconductor layer Act through contact holes, respectively.

The second electrode CE2 of the storage capacitor Cst may overlap the first electrode CE1 with the interlayer insulating layer 115 therebetween and constitute the storage capacitor Cst. The interlayer insulating layer 115 may serve as a dielectric layer of the storage capacitor Cst.

The planarization layer 118 may be disposed on the second electrode CE2 of the storage capacitor Cst, the source electrode SE, and the drain electrode DE. The planarization layer 118 may include a single layer or a multilayer including an organic material and provide a flat upper surface. The planarization layer 118 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The light-emitting element may be disposed on the planarization layer 118. The light-emitting element may include a pixel electrode (or a first electrode), the emission layer 220, and an opposite electrode 230 (or a second electrode). In an embodiment, the first organic light-emitting diode OLED1, the second organic light-emitting diode OLED2, the third organic light-emitting diode OLED3, and the fourth organic light-emitting diode OLED4 may each be disposed on the planarization 118. The first organic light-emitting diode OLED1, the second organic light-emitting diode OLED2, the third organic light-emitting diode OLED3, and the fourth organic light-emitting diode OLED4 may respectively include a first pixel electrode 210R, a second pixel electrode 210G, a third pixel electrode 210B, and a fourth pixel electrode 210W. In an embodiment, the first organic light-emitting diode OLED1, the second organic light-emitting diode OLED2, the third organic light-emitting diode OLED3, and the fourth organic light-emitting diode OLED4 may include the emission layer 220 and the opposite electrode 230 in common.

The first pixel electrode 210R, the second pixel electrode 210G, the third pixel electrode 210B, and the fourth pixel electrode 210W may be disposed on the planarization layer 118. The first pixel electrode 210R, the second pixel electrode 210G, the third pixel electrode 210B, and the fourth pixel electrode 210W may each be connected to the thin-film transistor TFT. The first pixel electrode 210R, the second pixel electrode 210G, the third pixel electrode 210B, and the fourth pixel electrode 210W may each include a (semi) transparent electrode or a reflective electrode. In an embodiment, the first pixel electrode 210R, the second pixel electrode 210G, and the third pixel electrode 210B, and the fourth pixel electrode 210W may each include a reflective layer and a transparent or semi-transparent electrode layer on the reflective layer, wherein the reflective layer may include Ag, Mg, Al, Pt, Pd, Au, Ni, Nd, Jr, Cr, or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In an embodiment, the first pixel electrode 210R, the second pixel electrode 210G, the third pixel electrode 210B, and the fourth pixel electrode 210W may include ITO/Ag/ITO.

A bank layer 119 may be disposed on the planarization layer 118. The bank layer 119 may include openings respectively exposing the central portions of the first pixel electrode 210R, the second pixel electrode 210G, the third pixel electrode 210B, and the fourth pixel electrode 210W. Each opening may define an emission area of each of the first organic light-emitting diode OLED1, the second organic light-emitting diode OLED2, the third organic light-emitting diode OLED3, and the fourth organic light-emitting diode OLED4, for example, each of a first emission area EA1, a second emission area EA2, a third emission area EA3, and a fourth emission area EA4.

The bank layer 119 may cover the edges of each of the first pixel electrode 210R, the second pixel electrode 210G, the third pixel electrode 210B, and the fourth pixel electrode 210W. The bank layer 119 may prevent arcs and the like from occurring at the edges of the first pixel electrode 210R, the second pixel electrode 210G, and the third pixel electrode 210B by increasing a distance between the edges of the first pixel electrode 210R, the second pixel electrode 210G, the third pixel electrode 210B, and the fourth pixel electrode 210W, and the opposite electrode 230 over the first pixel electrode 210R, the second pixel electrode 210G, the third pixel electrode 210B, and the fourth pixel electrode 210W. The bank layer 119 may include at least one organic insulating material among polyimide, polyamide, an acrylic resin, benzocyclobutene, a phenolic resin, and the like and be formed by using spin coating and the like within the spirit and the scope of the disclosure.

The emission layer 220 of the first organic light-emitting diode OLED1, the second organic light-emitting diode OLED2, the third organic light-emitting diode OLED3, and the fourth organic light-emitting diode OLED4 may include a low-molecular weight organic material or a polymer organic material. Functional layers may be further selectively disposed under or below and on the emission layer 220, wherein the functional layers include a hole transport layer (HTL), a hole injection layer (HIL), an electron transport layer (ETL), an electron injection layer (EIL), and the like within the spirit and the scope of the disclosure. Though it is shown in FIGS. 4A and 4B that the emission layer 220 is provided as one body over of the first pixel electrode 210R, the second pixel electrode 210G, the third pixel electrode 210B, and the fourth pixel electrode 210W, the embodiment is not limited thereto. The emission layer 220 is be disposed to correspond to each of the first pixel electrode 210R, the second pixel electrode 210G, the third pixel electrode 210B, and the fourth pixel electrode 210W. However, various modifications may be made.

The emission layer 220 may have a stack structure including at least two emitting units to emit lights of different colors. In an embodiment, the emission layer 220 may include two or more emitting units and a charge-generating layer between the two or more emitting units, wherein the two or more emitting units may be sequentially stacked each other between the pixel electrode and the opposite electrode 230. In the case where the emission layer

220 may include the two or more emitting units and the charge-generating layer as described above, the first organic light-emitting diode OLED1, the second organic light-emitting diode OLED2, the third organic light-emitting diode OLED3, and the fourth organic light-emitting diode OLED4 may each be tandem light-emitting elements.

In an embodiment, the first organic light-emitting diode OLED1, the second organic light-emitting diode OLED2, the third organic light-emitting diode OLED3, and the fourth organic light-emitting diode OLED4 may each include a first emitting unit including a first emission layer, a second emitting unit including a second emission layer, and a third emitting unit including a third emission layer. In other words, the emission layer 220 may include a stack structure of the first emitting unit including the first emission layer, the second emitting unit including the second emission layer, and the third emitting unit including the third emission layer. The first emission layer may be a blue emission layer, the second emission layer may be a green emission layer, and the third emission layer may be a red emission layer. For example, the first emission layer may emit light in a first wavelength band, for example, emit light in a wavelength ranging from about 450 nm to about 490 nm, the second emission layer may emit light in a second wavelength band, for example, emit light in a wavelength ranging from about 495 nm to about 570 nm, and the third emission layer may emit light in a third wavelength band, for example, emit light in a wavelength ranging from about 630 nm to about 780 nm. For example, because the emission layer 220 of the fourth organic light-emitting diode OLED4 may include a structure in which the blue emission layer, the green emission layer, and the red emission layer may be stacked each other, the fourth pixel PX4-1 may emit white light. Because the fourth pixel PX4-1 emits white light, a light-extraction efficiency may improve, and thus, a brightness shortage issue in high-resolution products may be solved.

The opposite electrode 230 may be disposed on the emission layer 220 to correspond to the first pixel electrode 210R, the second pixel electrode 210G, the third pixel electrode 210B, and the fourth pixel electrode 210W. The opposite electrode 230 may be provided as one body over the organic light-emitting diodes. In an embodiment, the opposite electrode 230 may be a transparent or semi-transparent electrode and may include a metal thin film including Li, Ca, LiF/Ca, LiF/Al, Al, Ag, Mg, or compound thereof and having a small work function. A transparent conductive oxide (TCO) layer such as ITO, IZO, ZnO, or $In_2O_3$ may be further arranged on the metal thin film.

In an embodiment, first light may be generated from the first emission area EA1 of the first organic light-emitting diode OLED1 and emitted to the outside. The first emission layer EA1 may be defined by an opening of the bank layer 119. Second light may be generated from the second emission area EA2 of the second organic light-emitting diode OLED2 and emitted to the outside. The second emission layer EA2 may be defined by an opening of the bank layer 119. Third light may be generated from the third emission area EA3 of the third organic light-emitting diode OLED3 and emitted to the outside. The third emission layer EA3 may be defined by an opening of the bank layer 119. Fourth light may be generated from the fourth emission area EA4 of the fourth organic light-emitting diode OLED4 and emitted to the outside. The fourth emission layer EA4 may be defined by an opening of the bank layer 119.

The first emission area EA1, the second emission area EA2, the third emission area EA3, and the fourth emission area EA4 may be apart from one another. A region of the display area DA that is not the first emission area EA1, the second emission area EA2, the third emission area EA3, and the fourth emission area EA4 may be a non-emission area. The first emission area EA1, the second emission area EA2, the third emission area EA3, and the fourth emission area EA4 may be discriminated from one another by the non-emission area. In a plan view, the first emission area EA1, the second emission area EA2, the third emission area EA3, and the fourth emission area EA4 may be arranged in various configurations such as a stripe configuration, a PENTILE™ configuration, and the like within the spirit and the scope of the disclosure. In a plan view, the shape of the first emission area EA1, the shape of the second emission area EA2, the shape of the third emission area EA3, the shape of the fourth emission area EA4 may each be one of a polygon, a circular shape, and an elliptical shape.

A spacer (not shown) for preventing mask chopping may be further disposed on the bank layer 119. A spacer may be integrally provided with the bank layer 119. As an example, the spacer and the bank layer 119 may be simultaneously formed during the same process that uses a half-tone mask process.

The encapsulation layer 300 may be disposed on a display element and may cover the display element. Because the first organic light-emitting diode OLED1, the second organic light-emitting diode OLED2, the third organic light-emitting diode OLED3, and the fourth organic light-emitting diode OLED4 may be readily damaged by external moisture, oxygen or the like, the encapsulation layer 300 may cover and protect the first organic light-emitting diode OLED1, the second organic light-emitting diode OLED2, the third organic light-emitting diode OLED3, and the fourth organic light-emitting diode OLED4. The encapsulation layer 300 may cover the display area DA and extend to the outside of the display area DA. The encapsulation layer 300 may include at least one organic encapsulation layer and at least one inorganic encapsulation layer. As an example, the encapsulation layer 300 may include a first inorganic encapsulation layer 310, an organic encapsulation layer 320, and a second inorganic encapsulation layer 330.

Because the first inorganic encapsulation layer 310 is formed along a structure thereunder, an upper surface thereof may not be flat. The organic encapsulation layer 320 may cover the first inorganic encapsulation layer 310 and, unlike the first inorganic encapsulation layer 310, an upper surface of the organic encapsulation layer 320 may be approximately flat.

The first inorganic encapsulation layer 310 and the second inorganic encapsulation layer 330 may each include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), and silicon nitride ($SiN_x$), silicon oxynitride (SiON). The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

Even in case that cracks occur inside the encapsulation layer 300, the encapsulation layer 300 may prevent the cracks from being connected between the first inorganic encapsulation layer 310 and the organic encapsulation layer 320 or between the organic encapsulation layer 320 and the second inorganic encapsulation layer 330 through the above multi-layered structure. With this configuration, forming of a path through which external moisture or oxygen penetrates the display area DA may be prevented or reduced. Though not shown, other layers such as a capping layer may be disposed between the first inorganic encapsulation layer 310 and the opposite electrode 230 in case that needed.

The color panel 20 may include the upper substrate 400, a color filter layer 500, a refractive layer RL, a first capping layer CL1, a bank 600, a functional layer 700, and a second capping layer CL2. The upper substrate 400 may be disposed over the lower substrate 100 such that the light-emitting element is disposed therebetween. The upper substrate 400 may be disposed over the first organic light-emitting diode OLED1, the second organic light-emitting diode OLED2, the third organic light-emitting diode OLED3, and the fourth organic light-emitting diode OLED4.

The upper substrate 400 may include a color area CA overlapping the light-emitting element. In an embodiment, the color area CA may include a first color area CA1, a second color area CA2, a third color area CA3, and a fourth color area CA4. In a plan view, the first color area CA1 may overlap the first organic light-emitting diode OLED1 and/or the first emission area EA1. In a plan view, the second color area CA2 may overlap the second organic light-emitting diode OLED2 and/or the second emission area EA2. In a plan view, the third color area CA3 may overlap the third organic light-emitting diode OLED3 and/or the third emission area EA3. In a plan view, the fourth color area CA4 may be arranged between two adjacent third color areas CA3 and may overlap the fourth organic light-emitting diode OLED4 and/or the fourth emission area EA4.

The upper substrate 400 may include glass, metal, or a polymer resin. In the case where the upper substrate 400 is flexible or bendable, the upper substrate 400 may include, for example, a polymer resin including polyethersulphone, polyacrylate, polyetherimide, polyethylene naphthalate, polyethylene terephthalate, polyphenylene sulfide, polyarylate, polyimide, polycarbonate, and cellulose acetate propionate. In an embodiment, the upper substrate 400 may have a multi-layered structure including two layers and a barrier layer between the two layers, wherein the two layers include the above polymer resins, and the barrier layer may include an inorganic material such as silicon oxide ($SiO_2$), silicon nitride ($SiN_x$), silicon oxynitride (SiON), and the like within the spirit and the scope of the disclosure.

The color filter layer 500 may be disposed on the lower surface of the upper substrate 400 in a direction from the upper substrate 400 to the lower substrate 100. The color filter layer 500 may include a first color filter 510, a second color filter 520, and a third color filter 530. The first color filter 510 may be arranged in the first color area CA1 The second color filter 520 may be arranged in the second color area CA2. The third color filter 530 may be arranged in the third color area CA3. However, because the fourth color area CA4 should emit white light, the first color filter 510, the second color filter 520, and the third color filter 530 are not arranged in the fourth color area CA4.

The first color filter 510, the second color filter 520, and the third color filter 530 may each include a photosensitive resin material. The first color filter 510, the second color filter 520, and the third color filter 530 may each include dye representing a unique color. The first color filter 510 may transmit only light in a wavelength band ranging from about 630 nm to about 780 nm, the second color filter 520 may transmit only light in a wavelength band ranging from about 495 nm to about 570 nm, and the third color filter 530 may transmit only light in a wavelength band ranging from about 450 nm to about 490 nm.

The color filter layer 500 may reduce external light reflection of the display apparatus 1. As an example, in case that external light reaches the first color filter 510, only light in a wavelength band set in advance may pass through the first color filter 510 as described above, and light in the other wavelengths may be absorbed by the first color filter 510. Accordingly, among external light incident to the display apparatus 1, only light in the wavelength band set in advance may pass through the first color filter 510, and a portion of the light that passes through the first color filter 510 may be reflected by the opposite electrode 230 and/or the first pixel electrode 210R therebelow and emitted to outside. Because, among external light incident to where the first pixel PX1 is located, only a portion of the external light is reflected, external light reflection may be reduced. This description is applicable to the second color filter 520 and the third color filter 530.

The first color filter 510, the second color filter 520, and the third color filter 530 may overlap each other. The first color filter 510, the second color filter 520, and the third color filter 530 may overlap each other in the non-emission area and/or adjacent color areas CA. As an example, the first color filter 510, the second color filter 520, and the third color filter 530 may overlap each other between the first color area CA1 and the third color area CA3. A portion of the second color filter 520 may be arranged between the first color area CA1 and the third color area CA3, and a portion of the first color filter 510 may extend from the first color area CA1 to an adjacent color area and overlap the second color filter 520 and the third color filter 530. The third color filter 530 may extend from the third color area CA3 to an adjacent color area and overlap the first color filter 510 and the second color filter 520.

The first color filter 510, the second color filter 520, and the third color filter 530 may overlap each other between the second color area CA2 and the third color area CA3. A portion of the first color filter 510 may be arranged between the second color area CA2 and the third color area CA3. The second color filter 520 may extend from the second color area CA2 to an adjacent color area and overlap the first color filter 510 and the third color filter 530. The third color filter 530 may extend from the third color area CA3 to an adjacent color area and overlap the first color filter 510 and the second color filter 520.

The first color filter 510, the second color filter 520, and the third color filter 530 may overlap each other between the second color area CA2 and the first color area CA1 A portion of the third color filter 530 may be arranged between the second color area CA2 and the first color area CA1, and the second color filter 520 may extend from the second color area CA2 to an adjacent color area and overlap the first color filter 510 and the second color filter 520. The first color filter 510 may extend from the first color area CA1 to an adjacent color area and overlap the second color filter 520 and the third color filter 530.

The first color filter 510, the second color filter 520, and the third color filter 530 may overlap each other between the second color area CA2 and the fourth color area CA4. A portion of the first color filter 510 and the third color filter 530 may be arranged between the second color area CA2 and the fourth color area CA4. The second color filter 520 may extend from the second color area CA2 to a region between the second color area CA2 and the fourth color area CA4, but may not extend to the fourth color area CA4. For example, the first color filter 510, the second color filter 520, and the third color filter 530 may not be arranged in the fourth color area CA4. Accordingly, because white light in which red light, green light, and blue light are mixed and which is emitted from the fourth organic light-emitting diode OLED4 is emitted as it is without passing through the color filter layer 500, the fourth pixel PX4-1 may emit white light.

In an embodiment, the third color filter 530 may be stacked first on the upper substrate 400. The third color filter 530 may absorb a portion of external light incident from the outside of the upper substrate 400 and reduce the reflectivity of the display apparatus 1 because light reflected by the third color filter 530 is almost not viewed by users.

The refractive layer RL may be arranged in the color area CA. The refractive layer RL may be arranged in each of the first color area CA1, the second color area CA2, and the third color area CA3. The refractive layer RL may include an organic material. In an embodiment, the refractive index of the refractive layer RL may be less than the refractive index of the first capping layer CL1. In an embodiment, the refractive index of the refractive layer RL may be less than the refractive index of the color filter layer 500. Accordingly, the refractive layer RL may condense light.

The first capping layer CL1 may be disposed on the refractive layer RL and the color filter layer 500. In an embodiment, the first capping layer CL1 may be disposed between the color filter layer 500 and the functional layer 700. The first capping layer CL1 may protect the refractive layer RL and the color filter layer 500. The first capping layer CL1 may prevent or reduce impurities such as external moisture and/or air penetrating to damage or contaminate the refractive layer RL and/or the color filter layer 500. The first capping layer CL1 may include an inorganic material.

The bank 600 may be disposed on the first capping layer CL1. In an embodiment, the bank 600 may be disposed on the upper substrate 400. The bank 600 may be disposed on the lower surface of the upper substrate 400 facing the lower substrate 100. The bank 600 may include an organic material. Depending on the case, the bank 600 may include a light-blocking material to serve as a light-blocking layer. The light-blocking material may include, for example, at least one of black pigment, black dye, black particles, and metal particles.

The bank 600 may include openings. As an example, the bank 600 may include a central opening COP. In an embodiment, central openings COP may overlap the color area CA. As an example, a first central opening COP1 may overlap the first color area CA1. A second central opening COP2 may overlap the second central opening CA2. A third central opening COP3 may overlap the third central opening CA3.

The functional layer 700 may be disposed in the central opening COP of the bank 600. The functional layer 700 may fill the central opening COP. In an embodiment, the functional layer 700 may include at least one of a color-converting material and scatterers. In an embodiment, the color-converting material may include quantum dots. In an embodiment, the functional layer 700 may include a first color-converting layer 710, a second color-converting layer 720, a first transmissive layer 730, and a second transmissive layer 740.

The first color-converting layer 710 may be disposed in the first central opening COP1. The first color-converting layer 710 may overlap the first color area CA1. The first color-converting layer 710 may fill the first central opening COP1 of the bank 600 arranged in the first pixel PX1. The first color-converting layer 710 may overlap the first emission area EA1. The first pixel PX1 may include the first organic light-emitting diode OLED1 and the first color-converting layer 710.

The first color-converting layer 710 may convert light in the first wavelength band, generated in the emission layer 220 on the first pixel electrode 210R, into light in the third wavelength band. As an example, light in a wavelength band ranging from about 450 nm to about 495 nm among light emitted from the first organic light-emitting diode OLED1 may be converted into light in a wavelength band ranging from about 630 nm to about 780 nm by the first color-converting layer 710. Accordingly, in the first pixel PX1, light in the wavelength band ranging from about 630 nm to about 780 nm may be emitted to the outside through the upper substrate 400. In an embodiment, the first color-converting layer 710 may include first quantum dots QD1, first scatterers SC1, and a first base resin BR1. The first quantum dots QD1 and the first scatterers SC1 may be dispersed in the first base resin BR1.

The second color-converting layer 720 may be disposed on the second central opening COP2. The second color-converting layer 720 may overlap the second color area CA2. The second color-converting layer 720 may fill the second central opening COP2 of the bank 600 arranged in the second pixel PX2. The second color-converting layer 720 may overlap the second emission area EA2. The second pixel PX2 may include the second organic light-emitting diode OLED2 and the second color-converting layer 720.

The second color-converting layer 720 may convert light in the first wavelength band, generated in the emission layer 220 on the second pixel electrode 210G, into light in the second wavelength band. As an example, light in a wavelength band ranging from about 450 nm to about 490 nm among light emitted from the second organic light-emitting diode OLED2 may be converted into light in a wavelength band ranging from about 495 nm to about 570 nm by the second color-converting layer 720. Accordingly, in the second pixel PX2, light in the wavelength band ranging from about 495 nm to about 570 nm may be emitted to the outside through the upper substrate 400. In an embodiment, the second color-converting layer 720 may include second quantum dots QD2, second scatterers SC2, and a second base resin BR2. The second quantum dots QD2 and the second scatterers SC2 may be dispersed in the second base resin BR2.

The first transmissive layer 730 may be disposed in the third central opening COP3. The first transmissive layer 730 may overlap the third color area CA3. The first transmissive layer 730 may fill the third central opening COP3 of the bank 600 arranged in the third pixel PX3. The first transmissive layer 730 may overlap the third emission area EA3. The third pixel PX3 may include the third organic light-emitting diode OLED3 and the first transmissive layer 730.

The first transmissive layer 730 may emit light generated from the emission layer 220 on the third pixel electrode 210B to the outside without wavelength conversion. As an example, among light emitted from the first organic light-emitting diode OLED1, light in a wavelength band ranging from about 450 nm to about 490 nm may be emitted to the outside through the first transmissive layer 730 and the third color filter 530. In an embodiment, the first transmissive layer 730 may include third scatterers SC3 and a third base resin BR3. The third scatterers SC3 may be dispersed in the third base resin BR3. In an embodiment, the first transmissive layer 730 may not include quantum dots.

The second transmissive layer 740 may be disposed in a fourth central opening COP4. The second transmissive layer 740 may overlap the fourth color area CA4. The second transmissive layer 740 may fill the fourth central opening COP4 of the bank 600 arranged in the fourth pixel PX4-1.

The second transmissive layer 740 may overlap the fourth emission area CA4. The fourth pixel PX4-1 may include the fourth organic light-emitting diode OLED4 and the second transmissive layer 740.

Because the second transmissive layer 740 may include the same material or a similar material as a material of the first transmissive layer 730 and be formed during the same process as a process of forming the first transmissive layer 730, the number of processes may be advantageously reduced. The second transmissive layer 740 may emit light generated from the emission layer 220 on the fourth pixel electrode 210W to the outside without wavelength conversion. As an example, light emitted from the fourth organic light-emitting diode OLED4 may be emitted to the outside without wavelength conversion. In an embodiment, the second transmissive layer 740 may include fourth scatterers SC4 and a fourth base resin BR4. The fourth scatterers SC4 may be dispersed in the fourth base resin BR4. In an embodiment, the second transmissive layer 740 may not include quantum dots.

At least one of the first quantum dots QD1 and the second quantum dots QD2 may include a semiconductor material such as cadmium sulfide (CdS), cadmium telluride (CdTe), zinc sulfide (ZnS), indium phosphide (InP) or the like within the spirit and the scope of the disclosure. The size of the quantum dot may be several nanometers, and the wavelength of light after conversion may change depending on the size of the quantum dot.

In an embodiment, a core of the quantum dot may be one of a Group II-Group VI compound, a Group III-Group V compound, a Group IV-Group VI compound, a Group IV element, a Group IV compound, and a combination thereof.

A Group II-VI compound may include one of a two-element compound including one of CdSe, CdTe, ZnS, ZnSe, ZnTe, ZnO, HgS, HgSe, HgTe, MgSe, MgS, and a mixture thereof; a three-element compound including one of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including one of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A Group III-V compound may include one of a two-element compound including one of GaN, GaP, GaAs, GaSb, AN, AlP, AlAs, AlSb, InN, InP, InAs, InSb, and a mixture thereof; a three-element compound including one of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof; and a four-element compound including one of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A Group IV-VI compound may include one of a two-element compound including one of SnS, SnSe, SnTe, PbS, PbSe, PbTe, and a mixture thereof; a three-element compound including one of SnSeS, SnSeTe, SnSTe, PbSeS, PbSeTe, PbSTe, SnPbS, SnPbSe, SnPbTe, and a mixture thereof; and a four-element compound including one of SnPbSSe, SnPbSeTe, SnPbSTe, and a mixture thereof. A Group IV element may include one of Si, Ge, and a mixture thereof. A Group IV compound may include a two-element compound including one of SiC, SiGe, and a mixture thereof.

The two-element compound, the three-element compound, or the four-element compound may be present inside a particle at a uniform concentration, or may be divided into states with partially different concentration distributions and present in the same particle. A core-shell structure in which one quantum dot surrounds another quantum dot may be provided. An interface between the core and the shell may have a concentration gradient in which the concentration of an element existing in the shell reduces toward the center.

In an embodiment, a quantum dot may have a core-shell structure including a core and a shell, the core including a nano crystal, and the shell surrounding the core. The shell of a quantum dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell reduces toward the center. Examples of the shell of the quantum dot include oxide of metal or non-metal, a semiconductor compound, or a combination thereof.

As an example, though the oxide of metal or non-metal may include a two-element compounding including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a three-element compound including $MgAl_2O_4$, $CoFe_2O_4$, $NiFe_2O_4$, and $CoMn_2O_4$, the embodiment is not limited thereto.

Though the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, the embodiment is not limited thereto.

The quantum dot may have a full width of half maximum (FWHM) of a light emission wavelength spectrum of about 45 nm or less, for example about 40 nm or less, and by further example about 30 nm or less. Within this range, color purity or color reproduction may be improved. Because light emitted from the quantum dot is emitted in all directions, a viewing angle of light may be improved.

Though the shape of the quantum dot is a shape used in the art and is not particularly limited, the shape of the quantum dot may include a spherical shape, a pyramid shape, a multi-arm shape, or a cubic nano particle, a nano tube, a nano wire, a nano fiber, and a nano plate particle in an embodiment.

The quantum dot may adjust a color of light emitted light according to the size of a particle thereof, and thus, the quantum dot may have various emission colors such as blue, red, green, and the like within the spirit and the scope of the disclosure.

The first scatterers SC1, the second scatterers SC2, the third scatterers SC3, and the fourth scatterers SC4 may scatter light and allow more light to be emitted. The first scatterers SC1, the second scatterers SC2, the third scatterers SC3, and the fourth scatterers SC4 may increase a light-emission efficiency. At least one of the first scatterers SC1, the second scatterers SC2, the third scatterers SC3, and the fourth scatterers SC4 may include any one of metal and metal oxide for uniformly scattering light. As an example, at least one of the first scatterers SC1, the second scatterers SC2, the third scatterers SC3, and the fourth scatterers SC4 may include at least one of $TiO_2$, $ZrO_2$, $Al_2O_3$, $In_2O_3$, ZnO, $SnO_2$, $Sb_2O_3$, and ITO. At least one of the first scatterers SC1, the second scatterers SC2, the third scatterers SC3, and the fourth scatterers SC4 may have a refractive index of 1.5 or more. Accordingly, a light-emission efficiency of the functional layer 700 may improve. In an embodiment, at least one of the first scatterers SC1, the second scatterers SC2, the third scatterers SC3, and the fourth scatterers SC4 may be omitted.

The first base resin BR1, the second base resin BR2, the third base resin BR3, and the fourth base resin BR4 may include a light-transmissive material. As an example, at least one of the first base resin BR1, the second base resin BR2, the third base resin BR3, and the fourth base resin BR4 may include polymer resin such as acryl, benzocyclobutene (BCB) or hexamethyldisiloxane (HMDSO).

The second capping layer CL2 may be disposed on the bank layer 600 and the functional layer 700. The second capping layer CL2 may protect the bank layer 600 and the functional layer 700. The second capping layer CL2 may prevent or reduce impurities such as external moisture and/or air penetrating to damage or contaminate the bank layer 600 and/or the functional layer 700. The second capping layer CL2 may include an inorganic material.

In the display apparatus 1, light in the third wavelength band, by way of example, light in a wavelength band ranging from about 630 nm to about 780 nm may be emitted from the first pixel PX1 to the outside, light in the first wavelength band, by way of example, light in a wavelength band ranging from about 450 nm to about 490 nm may be emitted from the second pixel PX2 to the outside, and light in the second wavelength band, by way of example, light in a wavelength band ranging from about 495 nm to about 570 nm may be emitted from the third pixel PX3 to the outside. The fourth pixel PX4-1 additionally arranged between two adjacent third pixels PX3 may emit white light to the outside, and thus, the display apparatus 1 may display full-color images.

By way of example, the fourth organic light-emitting diode OLED4 of the fourth pixel PX4-1 is a tandem element that may emit all of red light, green light, and blue light, and the emission layer 220 of the fourth pixel PX4-1 may emit white light in which red light, green light, and blue light are mixed. Because the functional layer 700 disposed in the fourth pixel PX4-1 is the second transmissive layer 740, and the first color filter 510, the second color filter 520, and the third color filter 530 are not arranged in the fourth pixel PX4-1, white light emitted from the emission layer 220 may pass through the upper substrate 400 of the fourth pixel PX4-1 as it is and be emitted to the outside. Because the fourth pixel PX4-1 is additionally arranged in the non-pixel area excluding the first pixel PX1, the second pixel PX2, and the third pixel PX3, and white light emitted from the fourth pixel PX4-1 has a high light transmittance, a light-extraction efficiency of the color panel 20 and visibility may improve.

The filling layer 30 may be disposed between the emission panel 10 and the color panel In an embodiment, the filling layer 30 may be disposed between the encapsulation layer 300 and the functional layer 700. The filling layer 30 may perform a buffering function against external pressure and the like within the spirit and the scope of the disclosure. The filling layer 30 may include a filler. In an embodiment, the filling layer 30 may include a thermosetting or photo-curable filler. The filler may include an organic material such as methyl silicone, a phenyl silicone, polyimide and the like within the spirit and the scope of the disclosure. However, the filler is not limited thereto and may include an organic sealant such as a urethane-based resin, an epoxy-based resin, and an acryl-based resin, an inorganic sealant, or silicone.

One of the emission panel 10 and the color panel 20 may include a column spacer 800. In an embodiment, the color panel 20 may include the column spacer 800. In an embodiment, the emission panel 10 may include the column spacer 800. Hereinafter, the case where the color panel 20 may include the column spacer 800 is described in detail. The column spacer 800 may be disposed on the bank 600 and may face the lower substrate 100. The column spacer 800 may separate the encapsulation layer 300 from the bank 600. The column spacer 800 may pass through the filling layer 30. The column spacer 800 may include an organic material. In an embodiment, the column spacer 800 may include an acryl-based material.

The column spacer 800 may separate the light-emitting element from the functional layer 700 with a uniform interval. Accordingly, the filling layer 30 may be arranged in the display area DA with a uniform thickness. In other words, a distance by which the first organic light-emitting diode OLED1 is apart from the first color-converting layer 710 may be substantially equal to a distance by which the second organic light-emitting diode OLED2 is apart from the second color-converting layer 720. A distance by which the third organic light-emitting diode OLED3 is apart from the first transmissive layer 730 may be substantially equal to a distance by which the fourth organic light-emitting diode OLED4 is apart from the second transmissive layer 740. Unlike the embodiment, in the case where the column spacer 800 is omitted, a uniform interval between the light-emitting elements and the functional layer may not be maintained. As an example, the thickness of the filling layer 30 in the first color area CA1 may be different from the thickness of the filling layer 30 in the second color area CA2. The brightness of light emitted from the first organic light-emitting diode OLED1 and passing through the filling layer 30 overlapping the first color area CA1 may be different from the brightness of light emitted from the second organic light-emitting diode OLED2 and passing through the filling layer 30 overlapping the second color area CA2. In an embodiment, the column spacer 800 may be arranged to pass through the filling layer 30 and may separate the light-emitting element from the functional layer 700 with a uniform interval. Due to the filling layer 30, a phenomenon that brightness differs depending on the position in the display area DA may be prevented or reduced.

Figure 5:
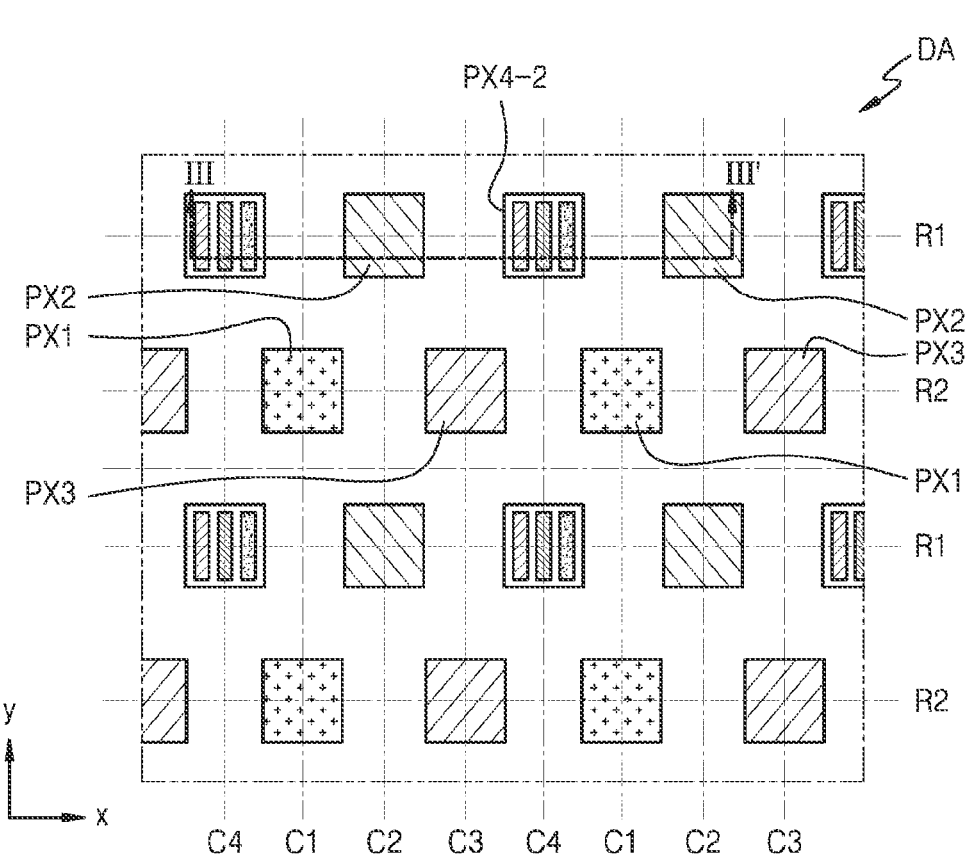
FIG. 5 is a schematic plan view of a portion of a display area of a display apparatus according to an embodiment.
Figure 6:
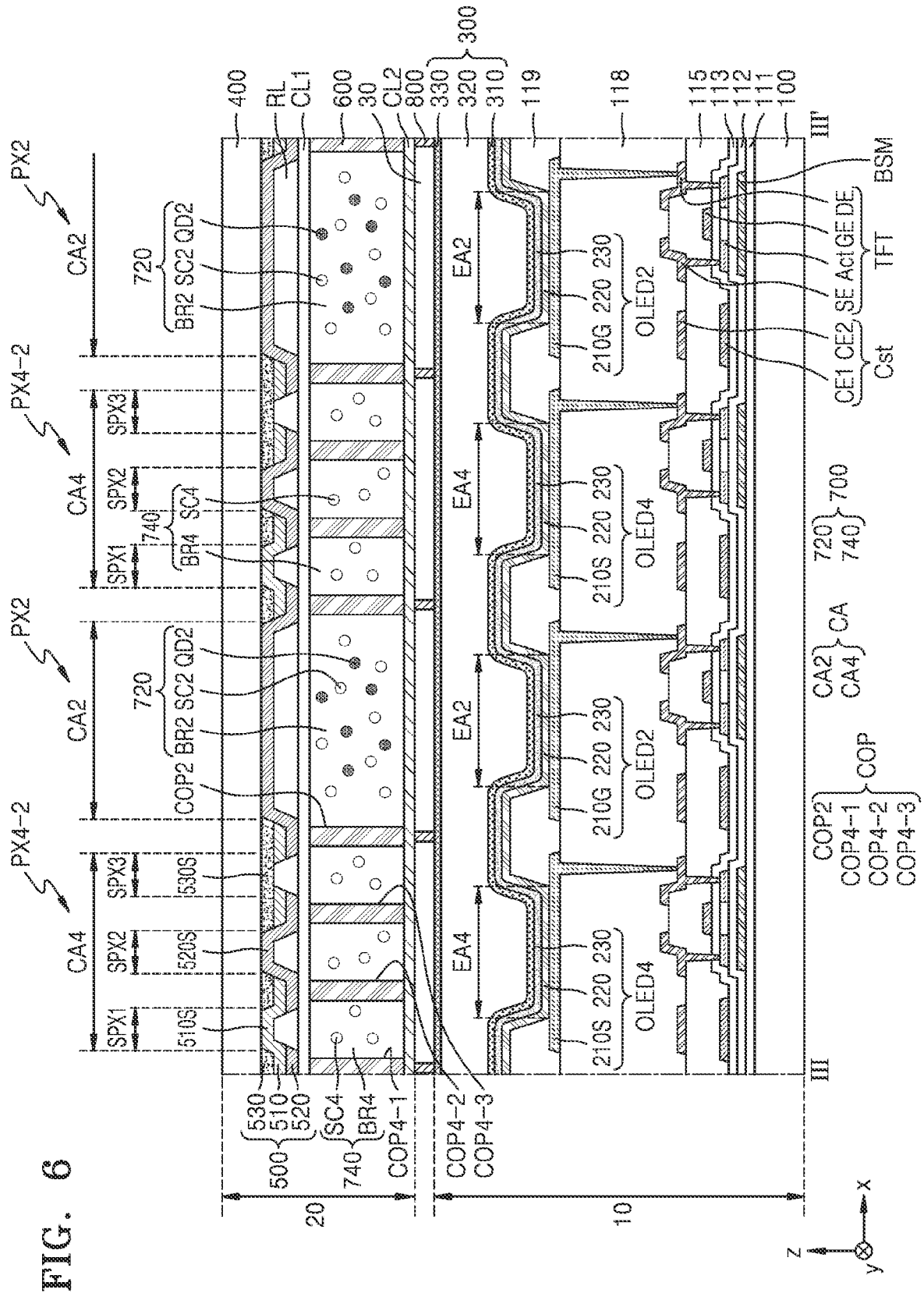
FIG. 6 is a schematic cross-sectional view of a color panel of FIG. 5, taken along line III-III' of FIG. 5.

FIG. 5 is a schematic plan view of a portion of a display area of a display apparatus according to an embodiment, and FIG. 6 is a schematic cross-sectional view of a color panel of FIG. 5, taken along line III-III' of FIG. 5. Referring to FIGS. 5 and 6, the other characteristics except for the characteristic of a fourth pixel PX4-2 are the same as those described with reference to FIGS. 3 and 4B. Same reference numerals among elements of FIGS. 5 and 6 are replaced with those previously described with reference to FIGS. 3 to 4B, and differences are described below.

Referring to FIG. 5, the display apparatus 1 may include an array of the pixels arranged in the display area DA. The array of the pixels may include the first pixels PX1, the second pixels PX2, the third pixels PX3, and the fourth pixels PX4-2 arranged two dimensionally. In an embodiment, the array of the pixels may have configuration in which a minimal repeating unit is repeatedly arranged in the x direction and the y direction, wherein the minimal repeating unit may include one first pixel PX1, one second pixel PX2, one third pixel PX3, and the fourth pixel PX4-2.

The pixels are arranged in the x direction, in which the array of the pixels may have a configuration where two rows in the x direction are repeatedly arranged. The second pixels PX2 and the fourth pixels PX4-2 may be alternately arranged in a first row R1 in the x direction, and the first pixels PX1 and the third pixels PX3 may be alternately arranged in a second row R2 parallel to the first row R1 and in the x direction. The array of the pixels may have a structure, in which the first row R1 and the second row R2 having the above structure are repeatedly arranged.

The pixels are arranged in the y direction, in which the pixels emit light of the same color may be arranged in each column in the y direction. The first pixels PX1 may be arranged along a first column C1, the second pixels PX2 may be arranged along a second column C2, and the third pixels PX3 may be arranged along a third column C3. Because one of the fourth pixels PX4-2 may be arranged between two adjacent second pixels PX2, the fourth pixels PX4-2 may be arranged along the fourth column C4 in the y direction as shown in FIG. 5. The array of the pixels may have a structure, in which the first column C1, the second column C2, the third column C3, and the fourth column C4 are repeatedly arranged. The fourth pixel PX4-2 is described below in detail with reference to FIG. 6.

Referring to FIG. 6, the light-emitting element may include the first organic light-emitting diode OLED1, the second organic light-emitting diode OLED2, the third organic light-emitting diode OLED3, and the fourth organic light-emitting diode OLED4. The first organic light-emitting diode OLED1, the second organic light-emitting diode OLED2, the third organic light-emitting diode OLED3, and the fourth organic light-emitting diode OLED4 may respectively include the first pixel electrode 210R, the second pixel electrode 210G, the third pixel electrode 210B, and a fourth pixel electrode 210S.

The emission layer 220 of the first organic light-emitting diode OLED1, the second organic light-emitting diode OLED2, the third organic light-emitting diode OLED3, and the fourth organic light-emitting diode OLED4 may have a stack structure including at least two emitting units that emit lights of different colors. In the case where the emission layer 220 may include the two or more emitting units and the charge-generating layer as described above, the first organic light-emitting diode OLED1, the second organic light-emitting diode OLED2, the third organic light-emitting diode OLED3, and the fourth organic light-emitting diode OLED4 may each be tandem light-emitting elements.

In an embodiment, the first organic light-emitting diode OLED1, the second organic light-emitting diode OLED2, the third organic light-emitting diode OLED3, and the fourth organic light-emitting diode OLED4 may each include the first emitting unit including the first emission layer, the second emitting unit including the second emission layer, and the third emitting unit including the third emission layer. The first emission layer may be a blue emission layer, the second emission layer may be a green emission layer, and the third emission layer may be a red emission layer. For example, the first emission layer may emit light in a first wavelength band, for example, emit light in a wavelength ranging from about 450 nm to about 490 nm, the second emission layer may emit light in a second wavelength band, for example, emit light in a wavelength ranging from about 495 nm to about 570 nm, and the third emission layer may emit light in a third wavelength band, for example, emit light in a wavelength ranging from about 630 nm to about 780 nm. For example, because the emission layer 220 of the fourth organic light-emitting diode OLED4 may include a structure in which the blue emission layer, the green emission layer, and the red emission layer may be stacked each other, the fourth pixel PX4-2 may emit red light, green light, and blue light.

For this purpose, the fourth pixel PX4-2 may include sub-pixel areas, for example, a region emitting red light, a region emitting green light, and a region emitting blue light. The region emitting red light may be denoted by a first sub-pixel SPX1, the region emitting green light may be denoted by a second sub-pixel SPX2, and the region emitting blue light may be denoted by a third sub-pixel SPX3.

The color filter layer 500 may include the first color filter 510, the second color filter 520, and the third color filter 530. The first color filter 510 may be arranged in the first color area CA1 The second color filter 520 may be arranged in the second color area CA2. The third color filter 530 may be arranged in the third color area CA3. Because the fourth color area CA4 emits red light, green light, and blue light for each region, a first sub-color filter 510S may be disposed on the first sub-pixel SPX1, a second sub-color filter 520S may be disposed on the second sub-pixel SPX2, and a third sub-color filter 530S may be disposed on the third sub-pixel SPX3. The first sub-color filter 510S is a portion of the first color filter 510 and may include the same material or a similar material as a material of the first color filter 510. Like the first color filter 510, the first sub-color filter 510S may transmit only light in a wavelength band ranging from about 630 nm to about 780 nm. The second sub-color filter 520S is a portion of the second color filter 520 and may include the same material or a similar material as a material of the second color filter 520. Like the second color filter 520, the second sub-color filter 520S may transmit only light in a wavelength band ranging from about 495 nm to about 570 nm. The third sub-color filter 530S is a portion of the third color filter 530 and may include the same material or a similar material as a material of the third color filter 530. Like the third color filter 530, the third sub-color filter 530S may transmit only light in a wavelength band ranging from about 450 nm to about 490 nm.

The first sub-color filter 510S, the second sub-color filter 520S, and the third sub-color filter 530S may overlap each other. The first sub-color filter 510S, the second sub-color filter 520S, and the third sub-color filter 530S may overlap each other between adjacent sub-pixels. As an example, the first sub-color filter 510S, the second sub-color filter 520S, and the third sub-color filter 530S may overlap each other between the first sub-pixel SPX1 and the second sub-pixel SPX2. As an example, the first sub-color filter 510S, the second sub-color filter 520S, and the third sub-color filter 530S may overlap each other between the second sub-pixel SPX2 and the third sub-pixel SPX3.

The bank 600 may include the openings. As an example, the bank 600 may include the central opening COP. For example, the fourth pixel PX4-2 may include a first sub-central opening COP4-1, a second sub-central opening COP4-2, and a third sub-central opening COP4-3. In an embodiment, the central openings COP may overlap the color area CA. As an example, the second central opening COP2 may overlap the second color area CA2. The first sub-central opening COP4-1 may overlap the first sub-pixel SPX1. The second sub-central opening COP4-2 may overlap the second sub-pixel SPX2. The third sub-central opening COP4-3 may overlap the third sub-pixel SPX3.

The functional layer 700 may be disposed in the central opening COP of the bank 600. The functional layer 700 may fill the central opening COP. The functional layer 700 may include the first color-converting layer 710, the second color-converting layer 720, the first transmissive layer 730, and the second transmissive layer 740.

The second transmissive layer 740 may be disposed in each of the first sub-central opening COP4-1, the second sub-central opening COP4-2, and the third sub-central opening COP4-3. The second transmissive layer 740 may overlap each of the first sub-pixel SPX1, the second sub-pixel SPX2, and the third sub-pixel SPX3 of the fourth color area CA4.

The second transmissive layer 740 may fill the first sub-central opening COP4-1, the second sub-central opening COP4-2, and the third sub-central opening COP4-3 of the bank 600 arranged in the fourth pixel PX4-2. The second transmissive layer 740 may overlap the fourth emission area EA4. As an example, three second transmissive layers 740 arranged adjacent to each other may overlap one fourth emission area EA4. The fourth pixel PX4-2 may include the fourth organic light-emitting diode OLED4 and the second transmissive layer 740.

The second transmissive layer 740 may include the same material or a similar material as a material of the first transmissive layer 730. Accordingly, the second transmissive layer 740 may emit light generated from the emission layer 220 on the fourth pixel electrode 210S to the outside without wavelength conversion. As an example, in case that red light, green light, and blue light are generated by the emission layer 220 on the fourth pixel electrode 210S, the second transmissive layer 740 may emit each light to the outside without wavelength conversion. In an embodiment, the second transmissive layer 740 may include the fourth scatterers SC4 and the fourth base resin BR4. The fourth scatterers SC4 may be dispersed in the fourth base resin BR4. In an embodiment, the second transmissive layer 740 may not include quantum dots.

In the display apparatus 1, light in the third wavelength band, by way of example, light in a wavelength band ranging from about 630 nm to about 780 nm may be emitted from the first pixel PX1 to the outside, light in the first wavelength band, by way of example, light in a wavelength band ranging from about 450 nm to about 490 nm may be emitted from the second pixel PX2 to the outside, and light in the second wavelength band, by way of example, light in a wavelength band ranging from about 495 nm to about 570 nm may be emitted from the third pixel PX3 to the outside. In the display apparatus 1, the fourth pixel PX4-2 additionally arranged between two adjacent third pixels PX3 may include the first sub-pixel SPX1, the second sub-pixel SPX2, and the third sub-pixel SPX3, and the sub-pixels may emit red light, green light, and blue light to the outside, thereby displaying full-color images.

By way of example, the fourth organic light-emitting diode OLED4 of the fourth pixel PX4-2 is a tandem element that may emit all of red light, green light, and blue light, and the emission layer 220 of the fourth pixel PX4-2 may emit red light, green light, and blue light. The functional layer 700 arranged in the fourth pixel PX4-2 is the second transmissive layer 740, and light may progress toward the color filter layer 500 without wavelength conversion of light. However, in the fourth pixel PX4-2, because the first sub-color filter 510S, the second sub-color filter 520S, and the third sub-color filter 530S are disposed in the color filter layer 500, among light passing through the second transmissive layer 740, only red light may be emitted from the first sub-pixel SPX1 to the outside, only green light may be emitted from the second sub-pixel SPX2 to the outside, and only blue light may be emitted from the third sub-pixel SPX3 to the outside. For example, because the fourth pixel PX4-2 additionally arranged may include the first sub-pixel SPX1, the second sub-pixel SPX2, and the third sub-pixel SPX3 respectively emitting red light, green light, and blue light, a light-extraction efficiency and visibility may improve. In the fourth pixel PX4-2, because the sub-pixel regions may respectively emit red light, green light, and blue light, reflectivity may be reduced compared to the case where white light is completely emitted.

Figure 7:
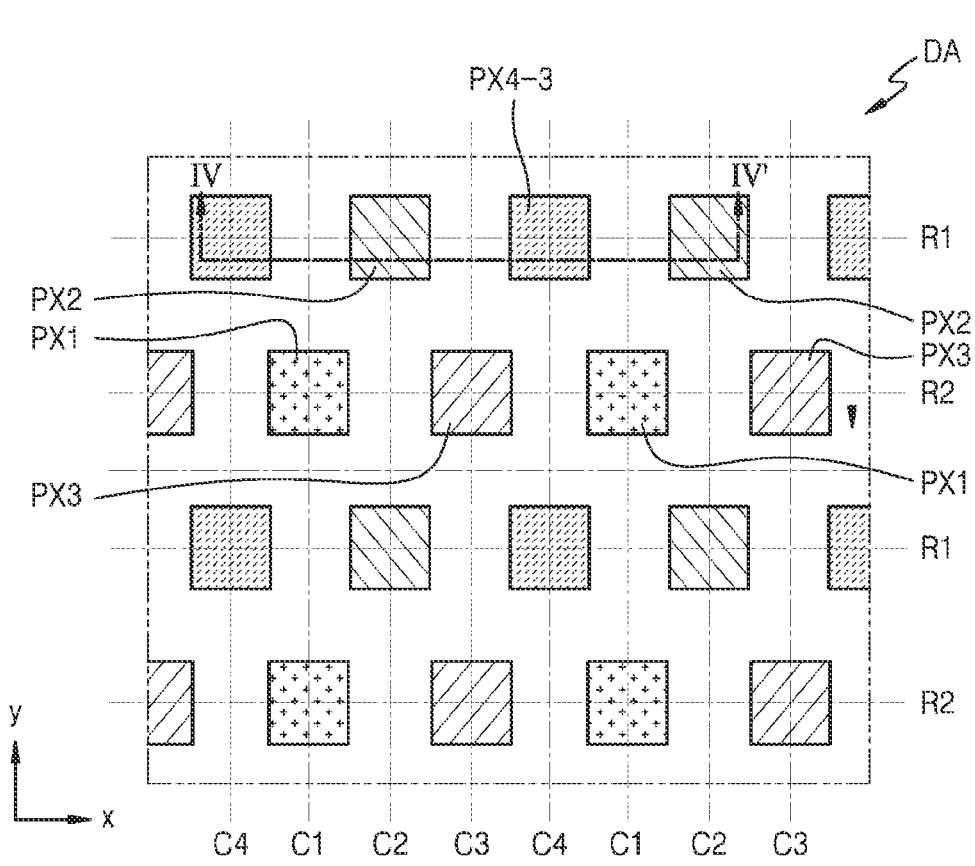
FIG. 7 is a schematic plan view of a portion of a display area of a display apparatus according to an embodiment.
Figure 8:
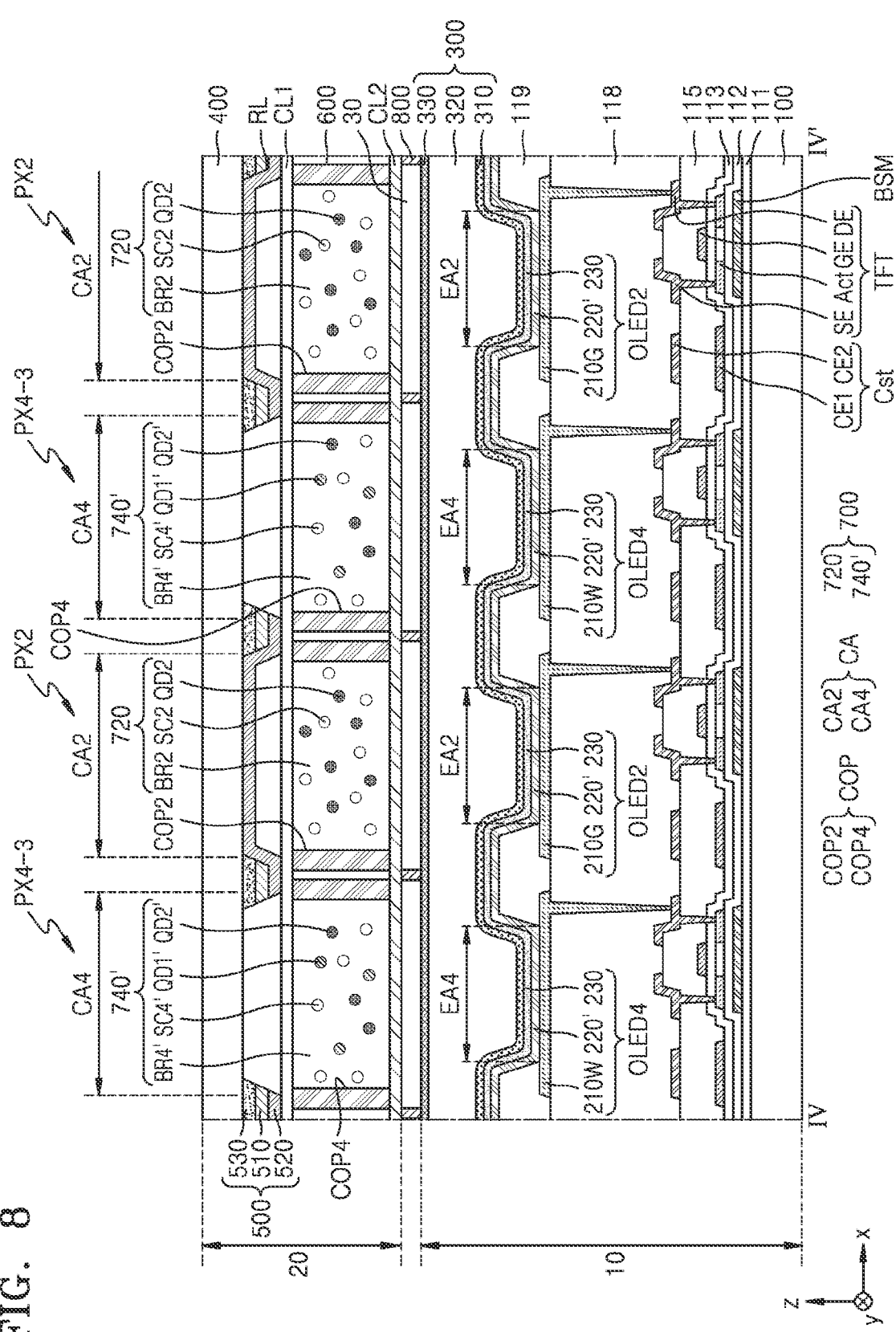
FIG. 8 is a schematic cross-sectional view of a color panel of FIG. 7, taken along line IV-IV' of FIG. 7.

FIG. 7 is a schematic plan view of a portion of a display area of a display apparatus according to an embodiment, and FIG. 8 is a schematic cross-sectional view of the color panel of FIG. 7, taken along line IV-IV' of FIG. 7. Referring to FIGS. 7 and 8, the other characteristics except for the characteristic of an emission layer 220' and a fourth pixel PX4-3 are the same as those described with reference to FIGS. 3 to 4B. Same reference numerals among elements of FIGS. 7 and 8 are replaced with those previously described with reference to FIGS. 3 to 4B, and differences are described below.

Referring to FIG. 7, the display apparatus 1 may include an array of the pixels arranged in the display area DA. The array of the pixels may include the first pixels PX1, the second pixels PX2, the third pixels PX3, and the fourth pixels PX4-3 arranged two dimensionally. In an embodiment, the array of the pixels may have configuration in which a minimal repeating unit is repeatedly arranged in the x direction and the y direction, wherein the minimal repeating unit may include one first pixel PX1, one second pixel PX2, one third pixel PX3, and the fourth pixel PX4-3.

The pixels may be arranged in the x direction, in which the second pixels PX2 and the fourth pixels PX4-3 may be alternately arranged along a first row R1 in the x direction, and the first pixels PX1 and the third pixels PX3 may be alternately arranged along a second row R2 parallel to the first row R1 and in the x direction. The pixels may be arranged in the y direction, in which the first pixels PX1 may be arranged along a first column C1, the second pixels PX2 may be arranged along a second column C2, the third pixels PX3 may be arranged along a third column C3, and the fourth pixels PX4-3 may be arranged along a fourth column C4. The fourth pixel PX4-3 is described below in detail with reference to FIG. 8.

Referring to FIG. 8, the first organic light-emitting diode OLED1, the second organic light-emitting diode OLED2, the third organic light-emitting diode OLED3, and the fourth organic light-emitting diode OLED4 may include a pixel electrode, the emission layer 220' and the opposite electrode 230 in common.

The emission layer 220' may have a stack structure including at least two emitting units to emit lights of different colors. In the case where the emission layer 220' may include the two or more emitting units and the charge-generating layer as described above, the first organic light-emitting diode OLED1, the second organic light-emitting diode OLED2, the third organic light-emitting diode OLED3, and the fourth organic light-emitting diode OLED4 may each be tandem light-emitting elements.

In an embodiment, the first organic light-emitting diode OLED1, the second organic light-emitting diode OLED2, the third organic light-emitting diode OLED3, and the fourth organic light-emitting diode OLED4 may each include the first emitting unit including the first emission layer, and the second emitting unit including the second emission layer. The first emission layer may be a blue emission layer, and the second emission layer may be a green emission layer. For example, the first emission layer may emit light in the first wavelength band, for example, emit light in the wavelength band ranging from about 450 nm to about 490 nm, and the second emission layer may emit light in the second wavelength band, for example, emit light in the wavelength band ranging from about 495 nm to about 570 nm.

The functional layer 700 may be disposed in the central opening COP of the bank 600. The functional layer 700 may include the first color-converting layer 710, the second color-converting layer 720, the first transmissive layer 730, and a third color-converting layer 740'.

The third color-converting layer 740' may be disposed in the fourth central opening COP4. The third color-converting layer 740' may overlap the fourth color area CA4. The color-converting layer 740' may fill the fourth central opening COP4 of the bank 600 arranged in the fourth pixel PX4-3. The third color-converting layer 740' may overlap the fourth emission area EA4. The fourth pixel PX4-3 may include the fourth organic light-emitting diode OLED4 and the third color-converting layer 740'.

The third color-converting layer 740' may include both first quantum dots QD1' and second quantum dots QD2', wherein the first quantum dots QD1' are the same as the quantum dots included in the first color-converting layer 710 (see FIG. 4A), and the second quantum dots QD2' are the same as the quantum dots included in the second color-converting layer 720 (see FIG. 4B). For example, the third color-converting layer 740' may include a material in which the first color-converting layer 710 and the second color-converting layer 720 are mixed. Accordingly, light in the first wavelength band, generated in the emission layer 220' on the fourth pixel electrode 210W may be converted to light in the second wavelength band or light in the third wavelength band. As an example, among light emitted from the fourth organic light-emitting diode OLED4, light in a wavelength band ranging from about 450 nm to about 490 nm may be converted into light in a wavelength band ranging from about 495 nm to about 570 nm by the third color-converting layer 740'. As an example, in case that light in the wavelength band ranging from about 450 nm to about 490 nm is generated by the emission layer 220' on the fourth pixel electrode 210W, the third color-converting layer 740' may convert the light into light in a wavelength band ranging from about 630 nm to about 780 nm. Accordingly, from the fourth pixel PX4-3, light in the wavelength band ranging from about 450 nm to about 490 nm, or light in the wavelength band ranging from about 630 nm to about 780 nm may be emitted to the outside through the upper substrate 400. For example, even though only blue light or only green light is emitted by the emission layer 220', in case that the light passes through the third color-converting layer 740', all of red light, green light, and blue light may be emitted. Accordingly, the fourth pixel PX4-3 may emit white light in which red light, green light, and blue light are mixed, to the outside. In an embodiment, the third color-converting layer 740' may include the first quantum dots QD1', the second quantum dots QD2', fourth scatterers SC4', and a fourth base resin BR4'. The first quantum dots QD1', the second quantum dots QD2', and the fourth scatterers SC4' may be dispersed in the fourth base resin BR4'.

In the display apparatus 1, light in the third wavelength band, by way of example, light in a wavelength band ranging from about 630 nm to about 780 nm may be emitted from the first pixel PX1 to the outside, light in the first wavelength band, by way of example, light in a wavelength band ranging from about 450 nm to about 490 nm may be emitted from the second pixel PX2 to the outside, and light in the second wavelength band, by way of example, light in a wavelength band ranging from about 495 nm to about 570 nm may be emitted from the third pixel PX3 to the outside. The fourth pixel PX4-1 additionally arranged between two adjacent third pixels PX3 emits white light to the outside, and thus, the display apparatus 1 may display full-color images.

By way of example, even in the case where the fourth organic light-emitting diode OLED4 of the fourth pixel PX4-3 is a tandem element to emit only blue light or only green light, because the third color-converting layer 740' may include the first quantum dots QD1' and the second quantum dots QD2', the fourth pixel PX4-3 may emit white light in which red light, green light, and blue light are mixed, to the outside through the upper substrate 400. Because the fourth pixel PX4-1 is additionally arranged in the non-pixel area excluding the first pixel PX1, the second pixel PX2, and the third pixel PX3, and white light emitted from the fourth pixel PX4-3 has a high light transmittance, a light-extraction efficiency of the color panel and visibility may improve.

Figure 9:
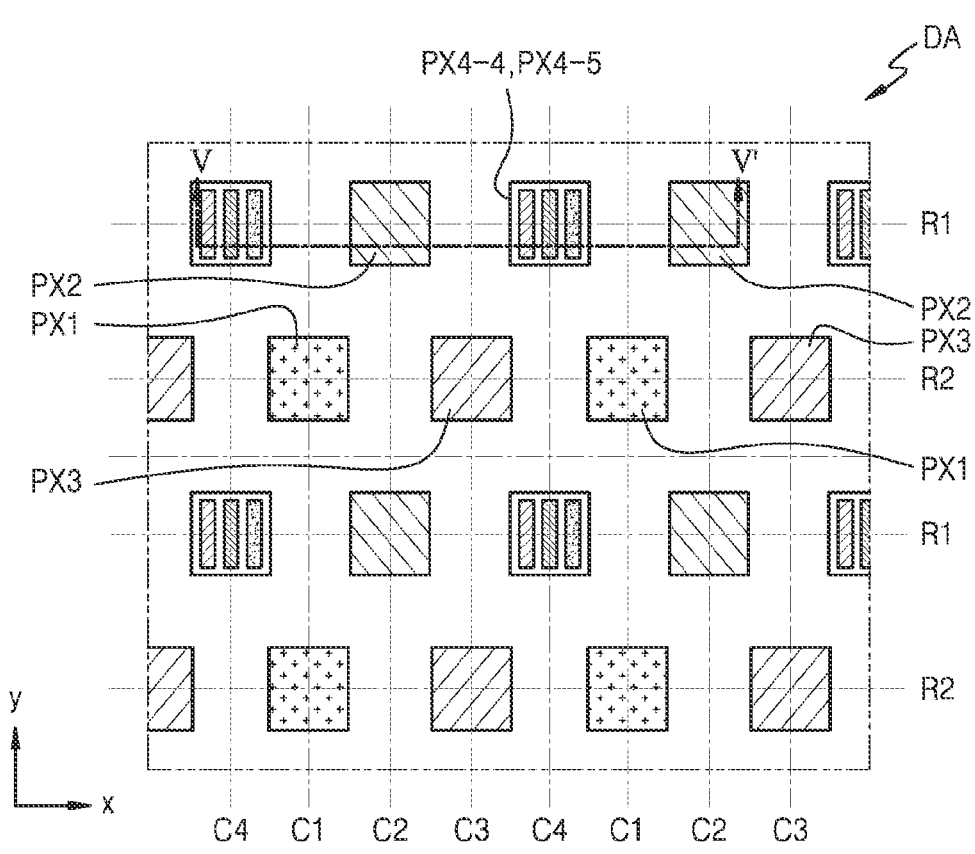
FIG. 9 is a schematic plan view of a portion of a display area of a display apparatus according to an embodiment.
Figure 10:
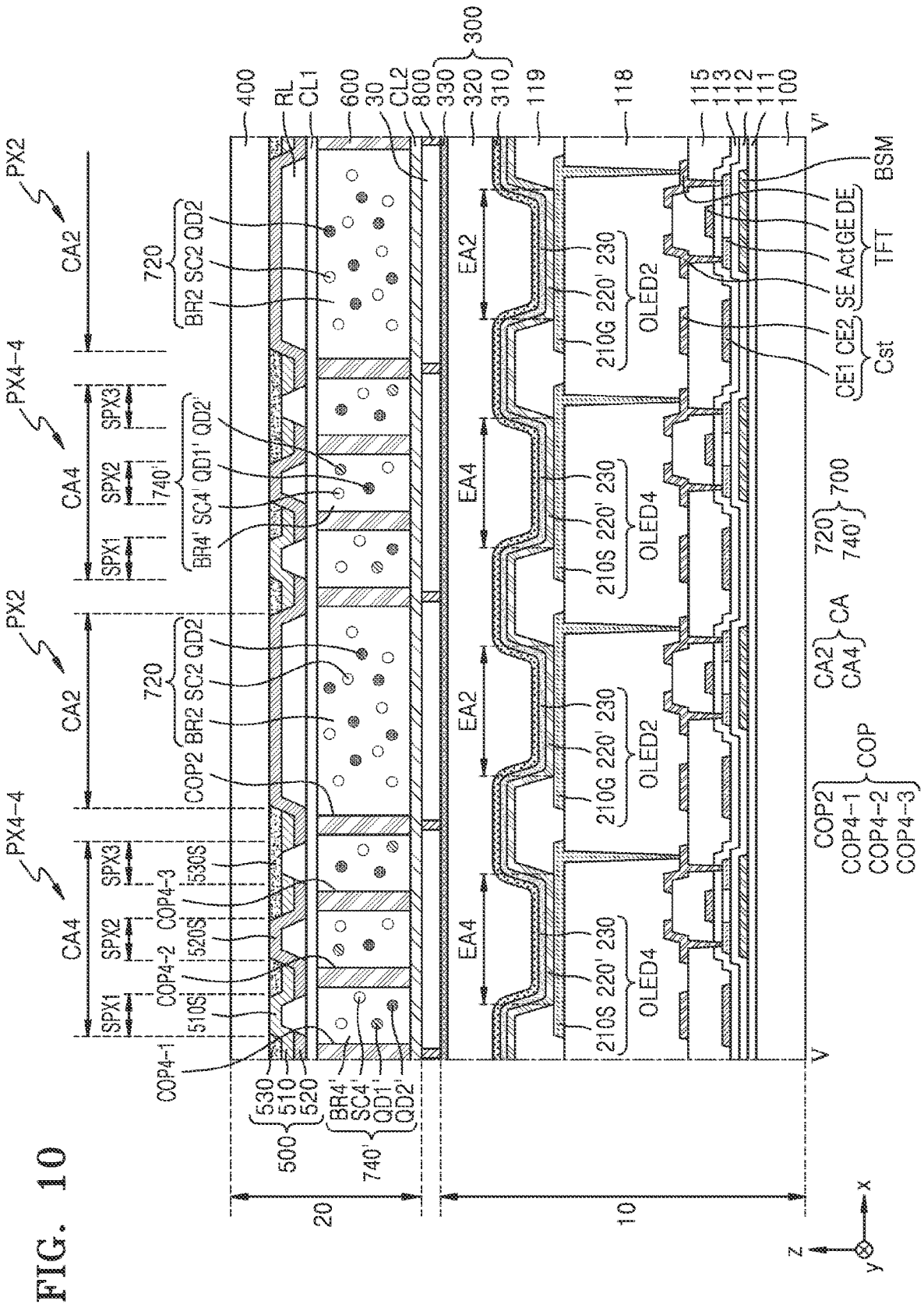
FIG. 10 is a schematic cross-sectional view of a color panel of FIG. 9, taken along line V-V' of FIG. 9.
Figure 11:
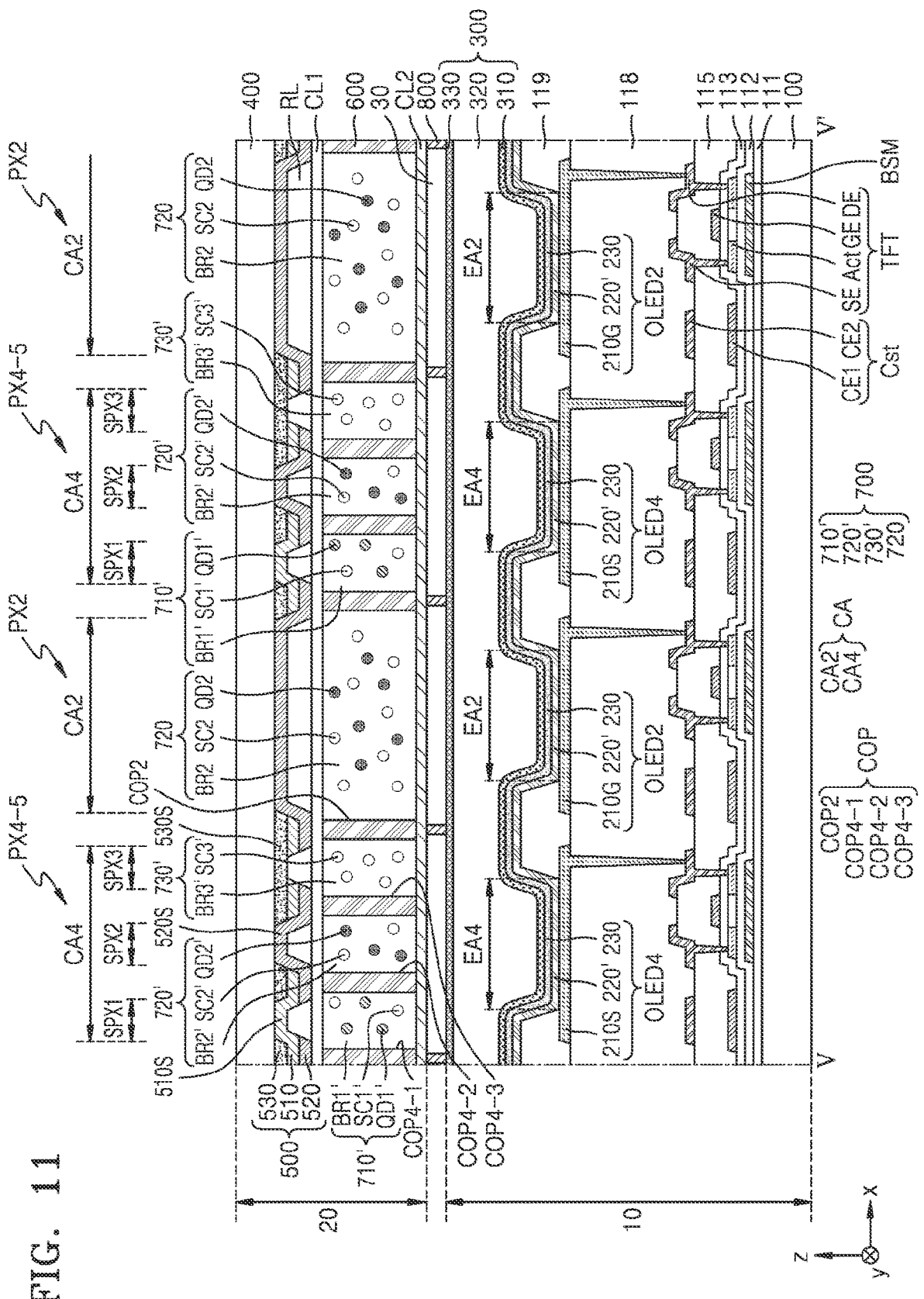
FIG. 11 is a schematic cross-sectional view of a color panel of FIG. 9, taken along line V-V' of FIG. 9.

FIG. 9 is a schematic plan view of a portion of the display area DA of the display apparatus 1 according to an embodiment, FIG. 10 is a schematic cross-sectional view of the color panel 20 of FIG. 9, taken along line V-V' of FIG. 9 according to an embodiment, and FIG. 11 is a schematic cross-sectional view of the color panel 20 of FIG. 9, taken along line V-V' of FIG. 9 according to an embodiment. Referring to FIGS. 9 and 11, the other characteristics except for the characteristic of the emission layer 220' and fourth pixel PX4-4 and PX4-5 are the same as those described with reference to FIGS. 5 and 6. Same reference numerals among elements of FIGS. 9 to 11 are replaced with those previously described with reference to FIGS. and 6, and differences are described below.

Referring to FIG. 9, the display apparatus 1 may include an array of the pixels arranged in the display area DA. The array of the pixels may include the first pixels PX1, the second pixels PX2, the third pixels PX3, and the fourth pixels PX4-4 and PX4-5 arranged two dimensionally. In an embodiment, the array of the pixels may have configuration in which a minimal repeating unit is repeatedly arranged in the x direction and the y direction, wherein the minimal repeating unit may include one first pixel PX1, one second pixel PX2, one third pixel PX3, and the fourth pixels PX4-4 and PX4-5.

The pixels may be arranged in the x direction, in which the second pixels PX2 and the fourth pixels PX4-4 and PX4-5 may be alternately arranged along a first row R1 in the x direction, and the first pixels PX1 and the third pixels PX3 may be alternately arranged along a second row R2 parallel to the first row R1 and in the x direction. The pixels may be arranged in the y direction, in which the first pixels PX1 may be arranged along a first column C1, the second pixels PX2 may be arranged along a second column C2, the third pixels PX3 may be arranged along a third column C3, and the fourth pixels PX4-4 and PX4-5 may be arranged along a fourth column C4. The fourth pixels PX4-4 an PX4-5 are described below in detail with reference to FIGS. 10 and 11.

Referring to FIGS. 10 and 11, the first organic light-emitting diode OLED1, the second organic light-emitting diode OLED2, the third organic light-emitting diode OLED3, and the fourth organic light-emitting diode OLED4 may include the pixel electrode, the emission layer 220' and the opposite electrode 230 in common.

The emission layer 220' may have a stack structure including at least two emitting units that emit lights of different colors. In the case where the emission layer 220' may include the two or more emitting units and the charge-generating layer as described above, the first organic light-emitting diode OLED1, the second organic light-emitting diode OLED2, the third organic light-emitting diode OLED3, and the fourth organic light-emitting diode OLED4 may each be tandem light-emitting elements.

In an embodiment, the first organic light-emitting diode OLED1, the second organic light-emitting diode OLED2, the third organic light-emitting diode OLED3, and the fourth organic light-emitting diode OLED4 may each include the first emitting unit including the first emission layer, and the second emitting unit including the second emission layer. The first emission layer may be a blue emission layer, and the second emission layer may be a green emission layer. For example, the first emission layer may emit light in the first wavelength band, for example, emit light in the wavelength band ranging from about 450 nm to about 490 nm, and the second emission layer may emit light in the second wavelength band, for example, emit light in the wavelength band ranging from about 495 nm to about 570 nm. For example, because the emission layer 220 of the fourth organic light-emitting diode OLED4 may include a structure in which the blue emission layer and the green emission layer may be stacked each other, the fourth pixel PX4-4 may emit blue light and green light.

First, referring to FIG. 10 in association with the fourth pixel PX4-4, the functional layer 700 may be disposed in the central opening COP of the bank 600. The functional layer 700 may fill the central opening COP. The functional layer 700 may include the first color-converting layer 710, the second color-converting layer 720, the first transmissive layer 730, and the third color-converting layer 740'.

The third color-converting layer 740' may be disposed in the first sub-central opening COP4-1, the second sub-central opening COP4-2, and the third sub-central opening COP4-3. The third color-converting layer 740' may overlap the first sub-pixel SPX1, the second sub-pixel SPX2, and the third sub-pixel SPX3 of the fourth color area CA4. The third color-converting layer 740' may fill the first sub-central opening COP4-1, the second sub-central opening COP4-2, and the third sub-central opening COP4-3 of the bank 600 arranged in the fourth pixel PX4-4. The third color-converting layer 740' may overlap the fourth emission area EA4. The fourth pixel PX4-4 may include the fourth organic light-emitting diode OLED4 and the third color-converting layer 740'.

The third color-converting layer 740' may include both first quantum dots QD1' and second quantum dots QD2', wherein the first quantum dots QD1' are the same as the quantum dots included in the first color-converting layer 710 (see FIG. 4A), and the second quantum dots QD2' are the same as the quantum dots included in the second color-converting layer 720 (see FIG. 4B). For example, the third color-converting layer 740' may include a material in which the first color-converting layer 710 and the second color-converting layer 720 are mixed. Accordingly, light in the first wavelength band, generated in the emission layer 220' on the fourth pixel electrode 210S may be converted to light in the second wavelength band or light in the third wavelength band. As an example, among light emitted from the fourth organic light-emitting diode OLED4, light in a wavelength band ranging from about 450 nm to about 490 nm may be converted into light in a wavelength band ranging from about 495 nm to about 570 nm by the third color-converting layer 740'. As an example, in case that light in the wavelength band ranging from about 450 nm to about 490 nm is generated by the emission layer 220' on the fourth pixel electrode 210S, the third color-converting layer 740' may convert the light into light in a wavelength band ranging from about 630 nm to about 780 nm. Accordingly, from the fourth pixel PX4-3, light in the wavelength band ranging from about 450 nm to about 490 nm, or light in the wavelength band ranging from about 630 nm to about 780 nm may be emitted to the outside through the upper substrate 400. For example, even though only blue light or only green light is emitted by the emission layer 220', in case that the light passes through the third color-converting layer 740', all of red light, green light, and blue light may be emitted. Accordingly, the fourth pixel PX4-3 may emit each of red light, green light, and blue light to the outside. In an embodiment, the third color-converting layer 740' may include the first quantum dots QD1', the second quantum dots QD2', fourth scatterers SC4', and a fourth base resin BR4'. The first quantum dots QD1', the second quantum dots QD2', and the fourth scatterers SC4' may be dispersed in the fourth base resin BR4'.

Referring to FIG. 11 in association with the fourth pixel PX4-5, the functional layer 700 may be disposed in the central opening COP of the bank 600. The functional layer 700 may fill the central opening COP. The functional layer 700 may include the first color-converting layer 710, the second color-converting layer 720, the first transmissive layer 730, a fifth color-converting layer 720', and a third transmissive 730'.

The fourth color-converting layer 710' may be disposed in a first sub-central opening COP4-1. The fourth color-converting layer 710' may overlap the first sub-pixel SPX1 of the fourth color area CA4. The fourth color-converting layer 710' may fill a first sub-central opening COP4-1 of the bank 600 arranged in the fourth pixel PX4-5. The fourth color-converting layer 710' may overlap the fourth emission area EA4. The fourth pixel PX4-5 may include the fourth organic light-emitting diode OLED4 and the fourth color-converting layer 710'.

The fourth color-converting layer 710' may include the same material or a similar material as a material of the first color-converting layer 710 (see FIG. 4A) of the first pixel PX1. For example, the fourth color-converting layer 710' may convert light in the first wavelength band, generated in the emission layer 220' on the fourth pixel electrode 210S, into light in the third wavelength band. As an example, among light emitted from the fourth organic light-emitting diode OLED4, light in a wavelength band ranging from about 450 nm to about 490 nm may be converted into light in a wavelength band ranging from about 630 nm to about 780 nm by the fourth color-converting layer 710'. Accordingly, from the first sub-pixel SPX1 of the fourth pixel PX4-5, light in the wavelength band ranging from about 630 nm to about 780 nm may be emitted to the outside through the upper substrate 400. In an embodiment, the fourth color-converting layer 710' may include first quantum dots QD1', first scatterers SC1', and a first base resin BR1'. The first quantum dots QD1' and the first scatterers SC1' may be dispersed in the first base resin BR1'.

The fifth color-converting layer 720' may be disposed in a second sub-central opening COP4-2. The fifth color-converting layer 720' may overlap the second sub-pixel SPX2 of the fourth color area CA4. The fifth color-converting layer 720' may fill a second sub-central opening COP4-2 of the bank 600 arranged in the fourth pixel PX4-5. The fifth color-converting layer 720' may overlap the fourth emission area EA4. The fourth pixel PX4-5 may include the fourth organic light-emitting diode OLED4 and the fourth color-converting layer 710'.

The fifth color-converting layer 720' may include the same material or a similar material as a material of the second color-converting layer 720 of the second pixel PX2. For example, the fifth color-converting layer 720' may convert light in the first wavelength band, generated in the emission layer 220' on the fourth pixel electrode 210S, into light in the second wavelength band. As an example, among light emitted from the fourth organic light-emitting diode OLED4, light in a wavelength band ranging from about 450 nm to about 490 nm may be converted into light in a wavelength band ranging from about 495 nm to about 570 nm by the fifth color-converting layer 720'. Accordingly, from the second sub-pixel SPX2 of the fourth pixel PX4-5, light in the wavelength band ranging from about 495 nm to about 570 nm may be emitted to the outside through the upper substrate 400. In an embodiment, the fifth color-converting layer 720' may include second quantum dots QD2', second scatterers SC2', and a second base resin BR2'. The second quantum dots QD2' and the second scatterers SC2' may be dispersed in the second base resin BR2'.

The third transmissive layer 730' may be disposed in the third sub-central opening COP4-3. The third transmissive layer 730' may overlap the third sub-pixel SPX3 of the fourth color area CA4. The third transmissive layer 730' may fill the third sub-central opening COP4-3 of the bank 600 arranged in the fourth pixel PX4-5. The third transmissive layer 730' may overlap the fourth emission area EA4. The fourth pixel PX4-5 may include the fourth organic light-emitting diode OLED4 and the third transmissive layer 730'.

The third transmissive layer 730' may include the same material or a similar material as a material of the first transmissive layer 730 (see FIG. 4A) of the third pixel PX3. For example, the third transmissive layer 730' may emit light generated from the emission layer 220' on the fourth pixel electrode 210S to the outside without wavelength conversion. As an example, among light emitted from the fourth organic light-emitting diode OLED4, light in a wavelength band ranging from about 450 nm to about 490 nm may be emitted to the outside through the third transmissive layer 730' without wavelength conversion. In an embodiment, the third transmissive layer 730' may include third scatterers SC3' and a third base resin BR3'. The third scatterers SC3' may be dispersed in the third base resin BR3'. In an embodiment, the third transmissive layer 730' may not include quantum dots.

In the display apparatus 1, light in the third wavelength band, by way of example, light in a wavelength band ranging from about 630 nm to about 780 nm may be emitted from the first pixel PX1 to the outside, light in the first wavelength band, by way of example, light in a wavelength band ranging from about 450 nm to about 490 nm may be emitted from the second pixel PX2 to the outside, and light in the second wavelength band, by way of example, light in a wavelength band ranging from about 495 nm to about 570 nm may be emitted from the third pixel PX3 to the outside. In the display apparatus 1, the fourth pixels PX4-4 and PX4-5 additionally arranged between two adjacent third pixels PX3 may include the first sub-pixel SPX1, the second sub-pixel SPX2, and the third sub-pixel SPX3, and the sub-pixels may emit red light, green light, and blue light to the outside, thereby displaying full-color images.

By way of example, even in the case where the fourth organic light-emitting diode OLED4 of the fourth pixels PX4-4 and PX4-5 is a tandem element that emits only green light and only blue light, because the third color-converting layer 740' of the fourth pixel PX4-4 may include the first quantum dots QD1' and the second quantum dots QD2', the fourth pixel PX4-4 may emit both green light and blue light. Because the color filter layer 500 of the fourth pixel PX4-4 may include the first sub-color filter 510S, the second sub-color filter 520S, and the third sub-color filter 530S, among light passing through the third color-converting layer 740', only red light may be emitted from the first sub-pixel SPX1 to the outside, only green light may be emitted from the second sub-pixel SPX2 to the outside, and only blue light may be emitted from the third sub-pixel SPX3 to the outside.

In the case of the fourth pixel PX4-5 of FIG. 11, the fourth color-converting layer 710' may be disposed in the first sub-central opening COP4-1 and light emitted from the emission layer 220' may be converted into red light, the fifth color-converting layer 720' may be disposed in the second sub-central opening COP4-2 and light emitted from the emission layer 220' may be converted into green light, and the third transmissive layer 730' may be disposed in the third sub-central opening COP4-3 and blue light emitted from the emission layer 220' may pass through the third transmissive layer 730' as it is. Because the color filter layer 500 of the fourth pixel PX4-5 may include the first sub-color filter 510S, the second sub-color filter 520S, and the third sub-color filter 530S, among light passing through the fourth color-converting layer 710', only red light may be emitted from the first sub-pixel SPX1 to the outside, among light passing through the fifth color-converting layer 720', only green light may be emitted from the second sub-pixel SPX2 to the outside, and among light passing through the third transmissive layer 730', only blue light may be emitted from the third sub-pixel SPX3 to the outside.

For example, because the fourth pixels PX4-4 and PX4-5 additionally arranged may include the first sub-pixel SPX1, the second sub-pixel SPX2, and the third sub-pixel SPX3 respectively emitting red light, green light, and blue light, a light-extraction efficiency and visibility may improve. In the fourth pixels PX4-4 and PX4-5, because the sub-pixel regions may respectively emit red light, green light, and blue light, reflectivity may be reduced compared to the case where white light is completely emitted.

Figure 12:
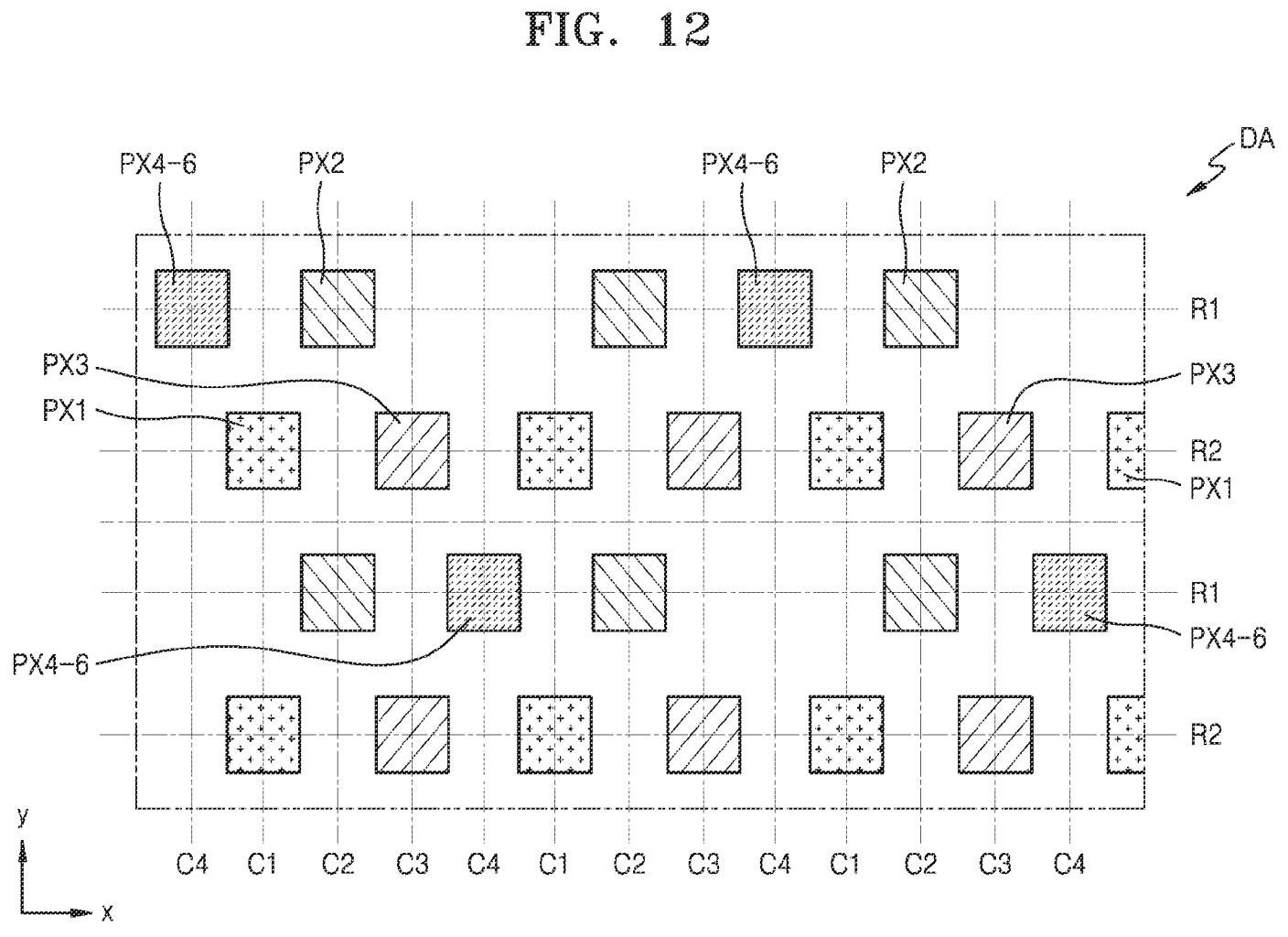
Figure 13:
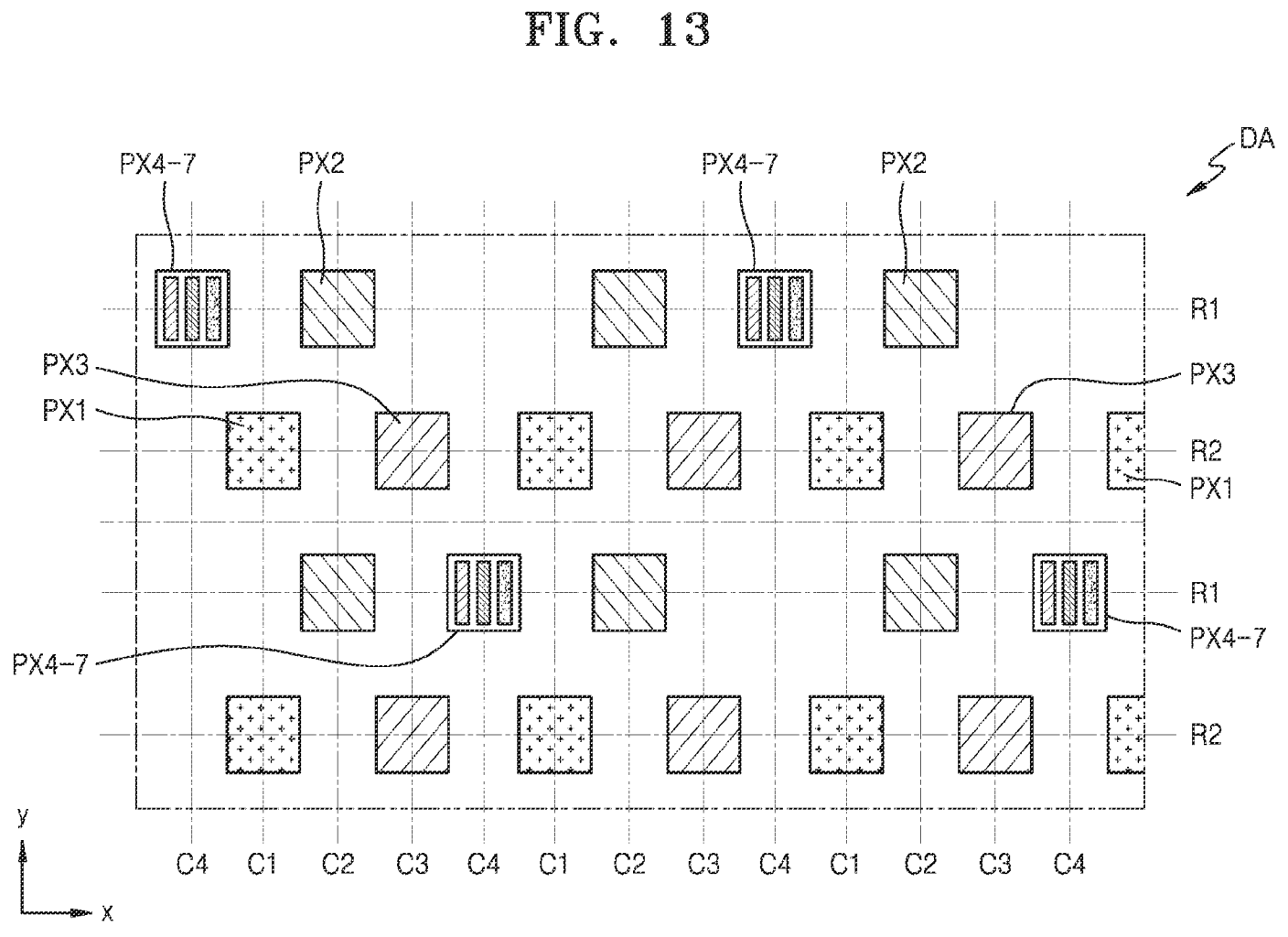

FIG. 12 is a schematic plan view of a portion of the display area DA of the display apparatus 1 according to an embodiment, and FIG. 13 is a schematic plan view of a portion of the display area DA of the display apparatus 1 according to an embodiment. Referring to FIGS. 12 and 13, the other characteristics except for the characteristic of fourth pixels PX4-6 and PX4-7 are the same as those described with reference to FIGS. 3 and 5. Same reference numerals among elements of FIGS. 12 and 13 are replaced with those previously described with reference to FIGS. 3 and 5, and differences are described below.

Referring to FIGS. 12 and 13, the display apparatus 1 may include an array of the pixels arranged in the display area DA. The array of the pixels may include the first pixels PX1, the second pixels PX2, the third pixels PX3, and the fourth pixels PX4-6 and PX4-7 arranged two dimensionally. In an embodiment, the array of the pixels may have configuration in which a minimal repeating unit is repeatedly arranged in the x direction and the y direction, wherein the minimal repeating unit may include one first pixel PX1, one second pixel PX2, and one third pixel PX3.

The pixels are arranged in the x direction, in which the array of the pixels may have a configuration where two rows in the x direction are repeatedly arranged. The second pixels PX2 may be arranged along the first row R1 in the x direction, and the first pixels PX1 and the third pixels PX3 may be alternately arranged along the second row R2 parallel to the first row R1 and in the x direction. The second pixels PX2 and the fourth pixels PX4-6 and PX4-7 may be arranged along the same row, and one of the fourth pixels PX4-6 and PX4-7 may be arranged between two adjacent second pixels PX2. The second pixels PX2 and the fourth pixels PX4-6 and PX4-7 may be arranged at a ratio of n:1 in the display area DA. For example, a pattern in which, in case that the second pixels PX2 are arranged n times, the fourth pixels PX4-6 and PX4-7 are arranged once may be repeated. In an embodiment, as shown in FIGS. 12 and 13, the second pixels PX2 and the fourth pixels PX4-6 and PX4-7 may be arranged at a ratio of 2:1 in the display area DA. In case that the second pixels PX2 are arranged twice along the first row R1 in the x direction, the fourth pixels PX4-6 and PX4-7 may be arranged once. In other words, the display apparatus has a pattern including first to n-th second pixels of the second pixels and one of the fourth pixels, n being a natural number, and the pattern is repeatedly disposed in the display apparatus.

Similar to the fourth pixel PX4-1 in FIG. 3, the fourth pixel PX4-6 may be a white pixel that emits white light. Like the fourth pixel PX4-2 of FIG. 5, the fourth pixel PX4-7 may be a pixel including the first sub-pixel SPX1 (see FIG. 6) of red light, the second sub-pixel SPX2 (see FIG. 6) of green light, and the third sub-pixel SPX3 (see FIG. 6) of blue light. For example, the fourth pixels PX4-6 and PX4-7 of the display apparatus 1 according to an embodiment may be a white pixel like the fourth pixel PX4-6 of FIG. 12, and may include, like the fourth pixel PX4-7 of FIG. 13, the first sub-pixel SPX1 (see FIG. 6) of red light, the second sub-pixel SPX2 (see FIG. 6) of green light, and the third sub-pixel SPX3 (see FIG. 6) of blue light. As an example, these may be selectively applied.

Because the first pixel PX1 may emit red light, the second pixel PX2 may emit green light, and the third pixel PX3 may emit blue light, the display apparatus 1 may display full-color images. Because the fourth pixels PX4-6 and PX4-7 are additionally arranged in the non-pixel area except for the first pixel PX1, the second pixel PX2, and the third pixel PX3, a light-extraction efficiency and visibility may improve. Furthermore, because not only the fourth pixels PX4-6 and PX4-7 and the second pixels PX2 are alternately arranged but, as shown in FIGS. 12 and 13, the fourth pixels PX4-6 and PX4-7 may be arranged in only a partial region with a preset ratio of each pixel, a light-extraction efficiency may be improved by a desired amount by taking into account reflectivity and the like within the spirit and the scope of the disclosure.

Figure 14A:
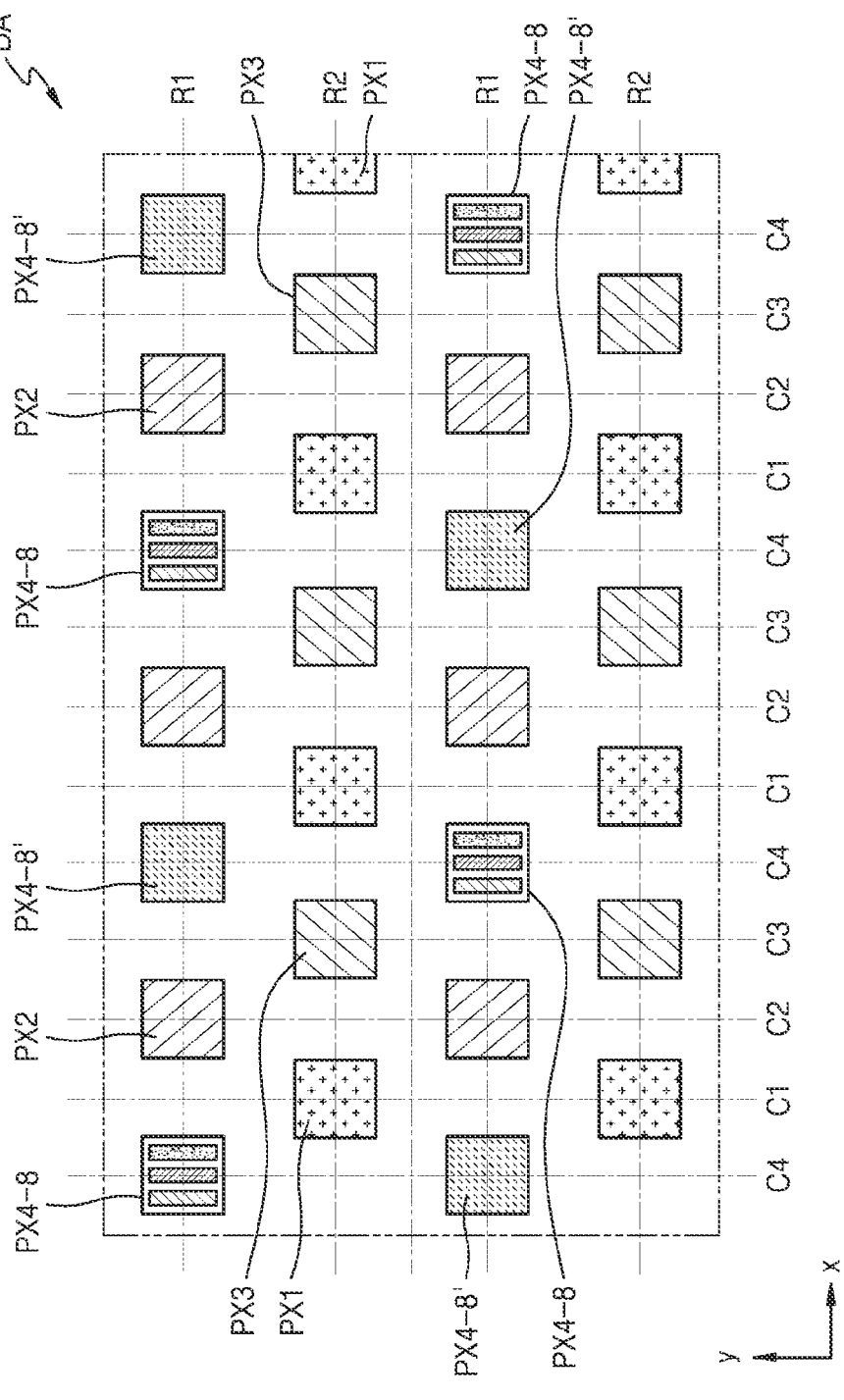
FIG. 14A is a schematic plan view of a portion of a display area of a display apparatus according to an embodiment.
Figure 14B:
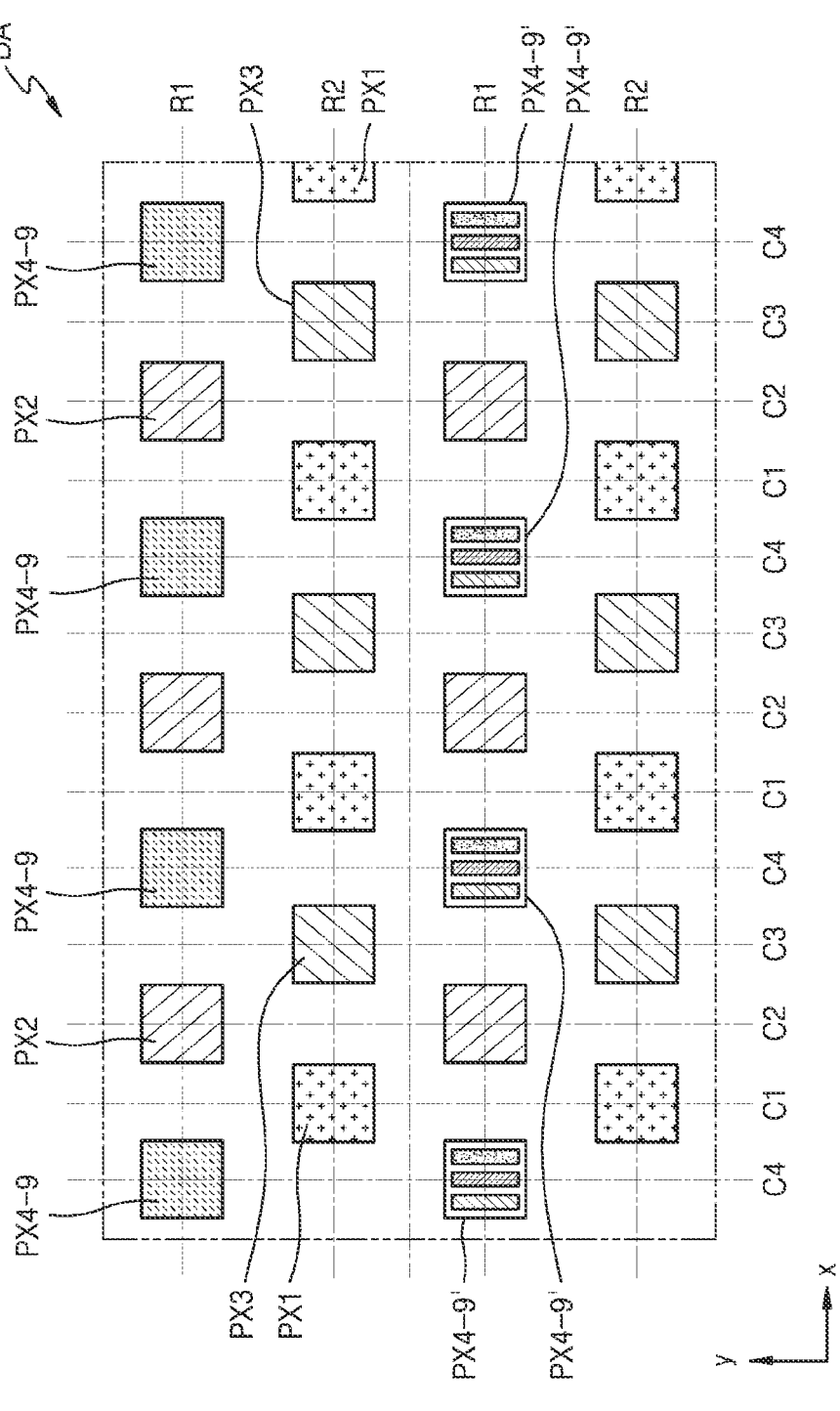
FIG. 14B is a schematic plan view of a portion of a display area of a display apparatus according to an embodiment.

FIG. 14A is a schematic plan view of a portion of the display area DA of the display apparatus 1 according to an embodiment, and FIG. 14B is a schematic plan view of a portion of the display area DA of the display apparatus 1 according to an embodiment. Referring to FIGS. 14A and 14B, the other characteristics except for the characteristic of fourth pixels PX4-8, PX4-8', PX4-9, and PX4-9' are the same as those described with reference to FIGS. 3 and 5. Same reference numerals among elements of FIGS. 14A and 14B are replaced with those previously described with reference to FIGS. 3 and 5, and differences are described below.

Referring to FIGS. 14A and 14B, the display apparatus 1 may include an array of the pixels arranged in the display area DA. The array of the pixels may include the first pixels PX1, the second pixels PX2, the third pixels PX3, and the fourth pixels PX4-8, PX4-8', PX4-9, and PX4-9' arranged two dimensionally. In an embodiment, the array of the pixels may have configuration in which a minimal repeating unit is repeatedly arranged in the x direction and the y direction, wherein the minimal repeating unit may include one first pixel PX1, one second pixel PX2, and one third pixel PX3.

The pixels are arranged in the x direction, in which the array of the pixels may have a configuration where two rows in the x direction are repeatedly arranged. The second pixels PX2 may be arranged along the first row R1 in the x direction, and the first pixels PX1 and the third pixels PX3 may be alternately arranged along the second row R2 parallel to the first row R1 and in the x direction.

The fourth pixels PX4-8, PX4-8', PX4-9, and PX4-9' may be arranged between two adjacent second pixels PX2. For example, the second pixels PX2 and the fourth pixels PX4-8, PX4-8', PX4-9, and PX4-9' may be arranged along the same row, and one of the fourth pixels PX4-8, PX4-8', PX4-9, and PX4-9' may be arranged between two adjacent second pixels PX2. The pixels may be arranged in the x direction, in which the second pixels PX2 and the fourth pixels PX4-8, PX4-8', PX4-9, and PX4-9' may be alternately arranged along the first row R1 in the x direction. The array of the pixels may have a structure, in which the first row R1 and the second row R2 having the above structure are repeatedly arranged.

The pixels are arranged in the y direction, in which the pixels that emit light of the same color may be arranged in each column in the y direction. The first pixels PX1 may be arranged along the first column C1, the second pixels PX2 may be arranged along the second column C2, and the third pixels PX3 may be arranged along the third column C3. Because the fourth pixels PX4-8, PX4-8', PX4-9, and PX4-9' are arranged between two adjacent second pixels PX2, the fourth pixels PX4-8, PX4-8', PX4-9, and PX4-9' may be arranged in the fourth column C4, and the first column C1, the second column C2, the third column C3, and the fourth column C4 may be repeatedly arranged.

Similar to the fourth pixel PX4-1 of FIG. 3, the fourth pixels PX4-8' and PX4-9 may be white pixels that emit white light, and like the fourth pixel PX4-2 of FIG. 5, the fourth pixels PX4-8 and PX4-9' may be pixels including the first sub-pixel SPX1 (see FIG. 6) of red light, the second sub-pixel SPX2 (see FIG. 6) of green light, and the third sub-pixel SPX3 (see FIG. 6) of blue light. In Some or a number of the fourth pixels PX4-8, PX4-8', PX4-9, and PX4-9' may be white pixels that emit white light, and the rest of the fourth pixels PX4-8, PX4-8', PX4-9, and PX4-9' may include the first sub-pixel SPX1, the second sub-pixel SPX2, and the third sub-pixel SPX3. For example, the fourth pixels PX4-8, PX4-8', PX4-9, and PX4-9' of the display apparatus 1 according to an embodiment may include white pixels, include the first sub-pixel SPX1 (see FIG. 6) of red light, the second sub-pixel SPX2 (see FIG. 6) of green light, and the third sub-pixel SPX3 (see FIG. 6) of blue light, or selectively employ these.

Referring to FIG. 14A, the fourth pixels PX4-8 and PX4-8' arranged along the same row may be arranged between adjacent second pixels PX2, and the fourth pixels PX4-8' emit white light and the fourth pixels PX4-8 emit all of red light, green light, and blue light may be alternately repeatedly arranged. For example, the white pixel, the first sub-pixel SPX1, the second sub-pixel SPX2, and the third sub-pixel SPX3 may be arranged along the same row. By way of example, the pixels may be arranged in the x direction, in which a pattern having the order of the fourth pixel PX4-8 and the second pixel PX2 to emit all of red, green, and blue light, the fourth pixel PX4-8' and the second pixel PX2 to emit white light may be repeatedly arranged along the first row R1. The pixels may be arranged in the y direction, in which the fourth pixel PX4-8 to emit all of red, green, and blue light, and the fourth pixel PX4-8' to emit white light may be alternately arranged along the fourth column C4.

Referring to FIG. 14B, the fourth pixels PX4-8 and PX4-8' may be arranged between adjacent second pixels PX2, the fourth pixels PX4-9 to emit white light may be arranged along the same row, and the fourth pixels PX4-9' to emit all of red, green, and blue light may be arranged on the same row. For example, the row in which the white pixel is arranged may be a parallel to and different from the row in which the first sub-pixel, the second sub-pixel, and the third sub-pixel are arranged. By way of example, the pixels may be arranged in the x direction, in which the fourth pixels PX4-9 to emit white light may be arranged between the adjacent second pixels PX2 in a first row R1, and the fourth pixels PX4-9' to emit all of red, green, and blue light may be arranged between the adjacent second pixels PX2 in a second first row R1. The pixels may be arranged in the y direction, in which the fourth pixel PX4-9 to emit white light and the fourth pixel PX4-9' to emit all of red, green, and blue light may be alternately arranged along the fourth column C4. For example, as shown in FIGS. 14A and 14B, a pattern in which the fourth pixel PX4-9 to emit white light and the fourth pixel PX4-9 to emit all of red, green, and blue light are arranged may be freely designed.

Because the first pixel PX1 may emit red light, the second pixel PX2 may emit green light, and the third pixel PX3 may emit blue light, the display apparatus 1 may display full-color images. Because the fourth pixels PX4-8, PX4-8', PX4-9, and PX4-9' are additionally arranged in the non-pixel area except for the first pixel PX1, the second pixel PX2, and the third pixel PX3, a light-extraction efficiency and visibility may improve.

However, in case that only the fourth pixels PX4-8' and PX4-9 to emit white light are additionally arranged in the display area DA, the white pixels have a high light trans-mittance, and thus, the reflectivity of the display apparatus 1 may increase. In the display apparatus 1 shown in FIGS. 14A and 14B, because not only the fourth pixels PX4-8 and PX4-9 to emit white light but the fourth pixels PX4-8 and PX4-9 to emit red, green, and blue light are arranged together in the region in which the fourth pixels PX may be arranged, the reflectivity due to the white pixels may be reduced. Accordingly, because the display apparatus accord-ing to an embodiment may have an improved light-extrac-tion efficiency and a reduced reflectivity, simultaneously, high-quality images may be implemented.

In the display apparatus according to an embodiment, the organic light-emitting diode may include two emission layers to emit lights of different colors, and the fourth pixels to emit white light are additionally arranged in a region except for the regions of the first pixel, the second pixel, and the third pixel. Accordingly, visibility and a light efficiency may improve. Because each of the fourth pixels may include sub-pixels to emit red, green, and blue light, a light effi-ciency may improve, and simultaneously, reflectivity may be reduced.

It should be understood that embodiments described herein should be considered in a descriptive sense only and not for purposes of limitation. Descriptions of features or aspects within each embodiment should typically be con-sidered as available for other similar features or aspects in other embodiments. While one or more embodiments have been described with reference to the figures, it will be understood by those of ordinary skill in the art that various changes in form and details may be made therein without departing from the spirit and scope and as defined by the following claims.

What is claimed is:

1. A display apparatus comprising:
organic light-emitting diodes disposed over a lower sub-strate, respectively corresponding to first pixels of a first color, second pixels of a second color, third pixels of a third color, and fourth pixels of a fourth color, and each of the organic light-emitting diodes including a stack structure of a first electrode, an intermediate layer, and a second electrode;

a first color-converting layer disposed on an organic light-emitting diode corresponding to one of the first pixels and including first quantum dots that convert incident light to light of the first color;

a first color filter disposed on the first color-converting layer and having the first color;

a second color-converting layer disposed on an organic light-emitting diode corresponding to one of the second pixels and including second quantum dots that convert the incident light to light of the second color;

a second color filter disposed on the second color-con-verting layer and having the second color; and a first transmissive layer disposed on an organic light-emitting diode corresponding to one of the third pixels, wherein the second pixels and the fourth pixels are disposed along a same row,
one of the fourth pixels is disposed between two adjacent second pixels, and
the intermediate layer includes at least two emission layers that emit lights of different colors,
wherein
the second pixels are disposed along a first row,
the first pixels and the third pixels are alternately disposed with the second pixels between the first pixels and the third pixels along a second row parallel to the first row, and
the first row and the second row are repeatedly disposed in a column direction.

2. The display apparatus of claim 1, wherein
the intermediate layer includes a first emission layer, a second emission layer, and a third emission layer, and
the first emission layer emits blue light, the second emission layer emits green light, and the third emission layer emits red light.

3. The display apparatus of claim 2, wherein the fourth pixels are white pixels that emit white light.

4. The display apparatus of claim 1, wherein
the intermediate layer includes a first emission layer and a second emission layer, and
the first emission layer emits blue light, and the second emission layer emits green light.

5. The display apparatus of claim 4, wherein the fourth pixels are white pixels that emit white light.

6. The display apparatus of claim 1, wherein the second pixels and the fourth pixels are alternately repeated along the first row.

7. The display apparatus of claim 1, wherein the display apparatus has a pattern including first to n-th second pixels of the second pixels and one of the fourth pixels, n being a natural number, and the pattern is repeatedly disposed in the display apparatus.

8. The display apparatus of claim 1, wherein
a number of the fourth pixels are white pixels that emit white light,
another number of the fourth pixels include a first sub-pixel, a second sub-pixel, and a third sub-pixel, and
the first sub-pixel and the first color emit light of a same color, the second sub-pixel and the second color emit light of a same color, and the third sub-pixel and the third color emit light of a same color.

9. The display apparatus of claim 8, wherein the white pixel, the first sub-pixel, the second sub-pixel, and the third sub-pixel are disposed along a same row.

10. The display apparatus of claim 8, wherein a row in which the white pixel is disposed and a row in which the first sub-pixel, the second sub-pixel, and the third sub-pixel are disposed is different rows parallel to each other.

11. A display apparatus comprising:

organic light-emitting diodes disposed over a lower substrate, respectively corresponding to first pixels of a first color, second pixels of a second color, third pixels of a third color, and fourth pixels of a fourth color, and each of the organic light-emitting diodes including a stack structure of a first electrode, an intermediate layer, and a second electrode;

a first color-converting layer disposed on an organic light-emitting diode corresponding to one of the first pixels and including first quantum dots that convert incident light to light of the first color;

a first color filter disposed on the first color-converting layer and having the first color;

a second color-converting layer disposed on an organic light-emitting diode corresponding to one of the second pixels and including second quantum dots that convert the incident light to light of the second color;

a second color filter disposed on the second color-converting layer and having the second color;

a first transmissive layer disposed on an organic light-emitting diode corresponding to one of the third pixels; and a second transmissive layer disposed on an organic light-emitting diode corresponding to one of the fourth pixels, wherein the second pixels and the fourth pixels are disposed along a same row, one of the fourth pixels is disposed between two adjacent second pixels, and the intermediate layer includes at least two emission layers that emit lights of different colors, wherein the intermediate layer includes a first emission layer, a second emission layer, and a third emission layer, and the first emission layer emits blue light, the second emission layer emits green light, and the third emission layer emits red light, wherein the fourth pixels are white pixels that emit white light, and wherein the first transmissive layer and the second transmissive layer include a same material.

12. A display apparatus comprising:

organic light-emitting diodes disposed over a lower substrate, respectively corresponding to first pixels of a first color, second pixels of a second color, third pixels of a third color, and fourth pixels of a fourth color, and each of the organic light-emitting diodes including a stack structure of a first electrode, an intermediate layer, and a second electrode;

a first color-converting layer disposed on an organic light-emitting diode corresponding to one of the first pixels and including first quantum dots that convert incident light to light of the first color;

a first color filter disposed on the first color-converting layer and having the first color;

a second color-converting layer disposed on an organic light-emitting diode corresponding to one of the second pixels and including second quantum dots that convert the incident light to light of the second color;

a second color filter disposed on the second color-converting layer and having the second color; and a first transmissive layer disposed on an organic light-emitting diode corresponding to one of the third pixels, wherein the second pixels and the fourth pixels are disposed along a same row, one of the fourth pixels is disposed between two adjacent second pixels, and the intermediate layer includes at least two emission layers that emit lights of different colors, wherein the intermediate layer includes a first emission layer, a second emission layer, and a third emission layer, and the first emission layer emits blue light, the second emission layer emits green light, and the third emission layer emits red light, and wherein the fourth pixels each include a first sub-pixel, a second sub-pixel, and a third sub-pixel, the first sub-pixel and the first color emit light of a same color, the second sub-pixel and the second color emit light of a same color, and the third sub-pixel and the third color emit light of a same color.

13. The display apparatus of claim 12, further comprising:

a second transmissive layer disposed on an organic light-emitting diode corresponding to one of the fourth pixels, wherein the first transmissive layer and the second transmissive layer include a same material.

14. The display apparatus of claim 12, wherein the first sub-pixel includes a first sub-color filter having the first color, the second sub-pixel includes a second sub-color filter having the second color, and the third sub-pixel includes a third sub-color filter having the third color.

15. A display apparatus comprising:

organic light-emitting diodes disposed over a lower substrate, respectively corresponding to first pixels of a first color, second pixels of a second color, third pixels of a third color, and fourth pixels of a fourth color, and each of the organic light-emitting diodes including a stack structure of a first electrode, an intermediate layer, and a second electrode;

a first color-converting layer disposed on an organic light-emitting diode corresponding to one of the first pixels and including first quantum dots that convert incident light to light of the first color;

a first color filter disposed on the first color-converting layer and having the first color;

a second color-converting layer disposed on an organic light-emitting diode corresponding to one of the second pixels and including second quantum dots that convert the incident light to light of the second color;

a second color filter disposed on the second color-converting layer and having the second color;

a first transmissive layer disposed on an organic light-emitting diode corresponding to one of the third pixels;

a third color-converting layer disposed on an organic light-emitting diode corresponding to one of the fourth pixels, and including the first quantum dots and the second quantum dots, wherein the second pixels and the fourth pixels are disposed along a same row, one of the fourth pixels is disposed between two adjacent second pixels, and the intermediate layer includes at least two emission layers that emit lights of different colors, and wherein the intermediate layer includes a first emission layer and a second emission layer, and the first emission layer emits blue light, and the second emission layer emits green light, and wherein the fourth pixels are white pixels that emit white light.

16. A display apparatus comprising:

organic light-emitting diodes disposed over a lower substrate, respectively corresponding to first pixels of a first color, second pixels of a second color, third pixels of a third color, and fourth pixels of a fourth color, and each of the organic light-emitting diodes including a stack structure of a first electrode, an intermediate layer, and a second electrode;

a first color-converting layer disposed on an organic light-emitting diode corresponding to one of the first pixels and including first quantum dots that convert incident light to light of the first color;

a first color filter disposed on the first color-converting layer and having the first color;

a second color-converting layer disposed on an organic light-emitting diode corresponding to one of the second pixels and including second quantum dots that convert the incident light to light of the second color;

a second color filter disposed on the second color-converting layer and having the second color; and a first transmissive layer disposed on an organic light-emitting diode corresponding to one of the third pixels, wherein the second pixels and the fourth pixels are disposed along a same row, one of the fourth pixels is disposed between two adjacent second pixels, and the intermediate layer includes at least two emission layers that emit lights of different color, and wherein the intermediate layer includes a first emission layer and a second emission layer, and the first emission layer emits blue light, and the second emission layer emits green light, and wherein the fourth pixels each include a first sub-pixel, a second sub-pixel, and a third sub-pixel, and the first sub-pixel and the first color emit light of a same color, the second sub-pixel and the second color emit light of a same color, and the third sub-pixel and the third color emit light of a same color.

17. The display apparatus of claim 16, wherein the first sub-pixel includes a first sub-color filter having the first color, the second sub-pixel includes a second sub-color filter having the second color, and the third sub-pixel includes a third sub-color filter having the third color.

18. The display apparatus of claim 17, further comprising:

a third color-converting layer disposed on an organic light-emitting diode corresponding to one of the first sub-pixel, the second sub-pixel, and the third sub-pixel, wherein the third color-converting layer includes the first quantum dots and the second quantum dots.

19. The display apparatus of claim 17, further comprising:

a fourth color-converting layer disposed inside of a region of the first sub-pixel;

a fifth color-converting layer disposed inside of a region of the second sub-pixel; and a third transmissive layer disposed inside of a region of the third sub-pixel, wherein the fourth color-converting layer and the first color-converting layer include a same material, the fifth color-converting layer and the second color-converting layer include a same material, and the third transmissive layer and the first transmissive layer include a same material.

* * * * *